United States Patent
Masuda

(10) Patent No.: US 8,981,881 B2
(45) Date of Patent: Mar. 17, 2015

(54) STACKED MODULE

(71) Applicant: Fujitsu Limited, Kawasaki (JP)

(72) Inventor: Satoshi Masuda, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 247 days.

(21) Appl. No.: 13/741,730

(22) Filed: Jan. 15, 2013

(65) Prior Publication Data
US 2013/0257565 A1 Oct. 3, 2013

(30) Foreign Application Priority Data

Mar. 28, 2012 (JP) ................. 2012-073958

(51) Int. Cl.
*H01P 1/00* (2006.01)
*H01P 3/02* (2006.01)
*H01L 23/498* (2006.01)
*H01L 23/66* (2006.01)
*H01L 25/065* (2006.01)
*H01L 23/047* (2006.01)
*H01L 25/16* (2006.01)
*H01L 23/15* (2006.01)

(52) U.S. Cl.
CPC ............ *H01P 3/02* (2013.01); *H01L 23/49822* (2013.01); *H01L 23/66* (2013.01); *H01L 25/0655* (2013.01); *H01L 23/047* (2013.01); *H01L 23/49833* (2013.01); *H01L 25/162* (2013.01); *H01L 2224/48091* (2013.01); *H01L 2224/48137* (2013.01); *H01L 2224/48227* (2013.01); *H01L 2924/19107* (2013.01); *H01L 23/15* (2013.01); *H01L 2223/6644* (2013.01); *H01L 2223/6683* (2013.01)
USPC ........... 333/247; 361/761; 361/820; 257/723; 257/728

(58) Field of Classification Search
USPC .......... 333/245–247; 257/664, 728, 773, 700, 257/723; 361/761, 820, 600, 601, 622, 361/679.01
See application file for complete search history.

(56) References Cited

U.S. PATENT DOCUMENTS

| | | | |
|---|---|---|---|
| 5,633,530 A * | 5/1997 | Hsu ............................. | 257/685 |
| 5,650,662 A | 7/1997 | Edwards et al. | |
| 6,335,669 B1 * | 1/2002 | Miyazaki et al. ............ | 333/247 |
| 7,569,925 B2 | 8/2009 | Nishizawa et al. | |
| 7,649,252 B2 | 1/2010 | Sakai et al. | |

FOREIGN PATENT DOCUMENTS

| | | |
|---|---|---|
| DE | 4338706 | 5/1995 |
| JP | 11-312751 | 11/1999 |
| JP | 2000-183230 | 6/2000 |

OTHER PUBLICATIONS

Extended European Search report mailed by EPO and corresponding to European Patent Application No. 13158337.9 on Jul. 4, 2013.

* cited by examiner

*Primary Examiner* — Lincoln Donovan
*Assistant Examiner* — Thomas Skibinski
(74) *Attorney, Agent, or Firm* — Fujitsu Patent Center

(57) ABSTRACT

A stacked module includes a first multilayer substrate including an opening having a stepwise wall face, and a first transmission line including a first grounding conductor layer, a second multilayer substrate supported on a stepped portion of the stepwise wall face and including a second transmission line including a second grounding conductor layer, a first chip mounted on a bottom of the opening and coupled to a third transmission line provided on the first multilayer substrate, and a second chip mounted on the front face of the second multilayer substrate and coupled to the second transmission line. A face to which the second grounding conductor layer or a fourth grounding conductor layer coupled thereto is exposed is joined to the stepped portion to which the first grounding conductor layer or a third grounding conductor layer coupled thereto is exposed, and the first and second grounding conductor layers are coupled.

11 Claims, 17 Drawing Sheets

US 8,981,881 B2

STACKED MODULE

CROSS-REFERENCE TO RELATED APPLICATION

This application is based upon and claims the benefit of priority of the prior Japanese Patent Application No. 2012-073958, filed on Mar. 28, 2012, the entire contents of which are incorporated herein by reference.

FIELD

The embodiments discussed herein are related to a stacked module.

BACKGROUND

With the progress of the broadband in recent years, the request for high-speed wireless communication of a large capacity is growing. For example, as regards amplifiers for a base station for a portable telephone set, those of the third generation have become widespread and it appears that base station amplifiers further progress to the fourth generation in the future, toward increase of the capacity. Further, it is estimated that also a new communication method (WiMAX) is placed into practical use and increase of the capacity further progresses in the future. Therefore, further increase of the output power and the efficiency, further miniaturization and further reduction of the cost are demanded for transmission/reception modules.

Meanwhile, for example, for a radar module (transmission/reception module including an amplifier), increase of the output power and increase of the bandwidth toward enhancement of a performance such as increase of the detection distance or enhancement of the resolution, and increase of the efficiency toward reduction of the operational cost and miniaturization of a cooler are demanded. Further, for example, in a phased array radar, it is necessary to dispose transmission/reception modules (radar modules) including an amplifier in an array in a small space, and further miniaturization of transmission/reception modules is demanded.

SUMMARY

According to an aspect of the embodiment, a stacked module includes a first multilayer substrate that includes an opening including a stepwise wall face, and a first transmission line configured from a first line conductor provided on a front face side of a first substrate and a first grounding conductor layer provided on a back face side of the first substrate, a second multilayer substrate supported on a stepped portion provided on the stepwise wall face of the opening and including a second transmission line configured from a second line conductor provided on a front face side of a second substrate and a second grounding conductor layer provided on a back face side of the second substrate, a first semiconductor chip mounted on a bottom face of the opening of the first multilayer substrate and electrically coupled to a third transmission line provided on the first multilayer substrate, and a second semiconductor chip mounted on the front face of the second multilayer substrate and electrically coupled to the second transmission line, wherein a face to which the second grounding conductor layer or a fourth grounding conductor layer electrically coupled to the second grounding conductor layer is exposed is joined to the stepped portion provided on the first grounding conductor layer or on the opposite side of the first grounding conductor layer across the substrate on the lower side of the first grounding conductor layer and to which a third grounding conductor layer electrically coupled to the first grounding conductor layer is exposed, and the first grounding conductor layer and the second grounding conductor layer are electrically coupled to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 17:
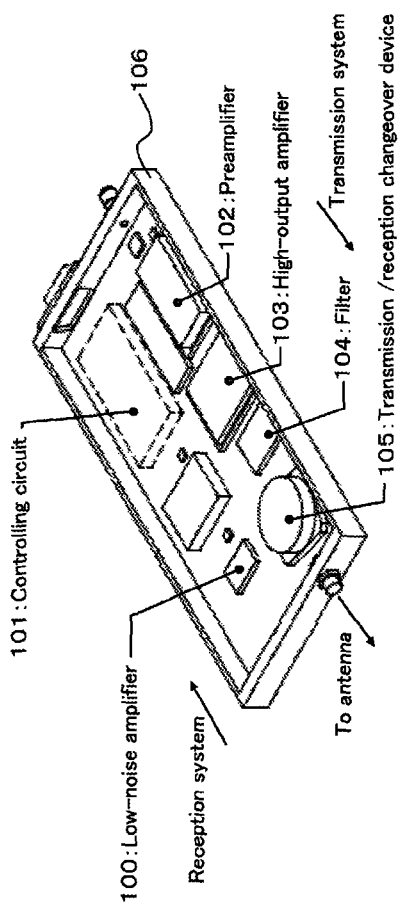
FIG. 17 is a schematic perspective view depicting a configuration of a conventional transmission/reception module.

Incidentally, for example, as shown in FIG. 17, a conventional transmission/reception module is configured such that amplifiers and passive devices such as, for example, a low-noise amplifier 100, a control circuit 101, a preamplifier 102, a high-output amplifier 103, a filter 104 and a transmission/reception changeover device 105 are accommodated in individually independent packages and mounted in a metal housing 106. Therefore, the module has a large size and it is difficult to miniaturize the module.

Therefore, it is conceivable to achieve miniaturization of a transmission/reception module by implementing the transmission/reception module using an HTCC technique in which a high-temperature co-fired ceramics (HTCC) substrate is used or an LTCC technique in which a low-temperature co-fired ceramics (LTCC) substrate is used as a multiplayer substrate. For example, it is conceivable to form components that configure a transmission/reception module as chips and mount the chips on a multilayer substrate to implement miniaturization of the transmission/reception module.

Further, it is conceivable to stack a plurality of multilayer substrates on which semiconductor chips are mounted to produce a stacked module so that the occupation area is reduced to implement further miniaturization.

However, as the frequency becomes higher, the transmission loss at a connection portion between one multilayer substrate and another multilayer substrate that configure a stacked module becomes higher, and it is difficult to implement reduction of the loss and increase of the bandwidth.

Therefore, it is desired to implement reduction of the loss and increase of the bandwidth while miniaturization is implemented by configuring a stacked module.

In the following, a stacked module according to an embodiment of the present invention is described with reference to FIGS. 1 to 6.

Figure 1:
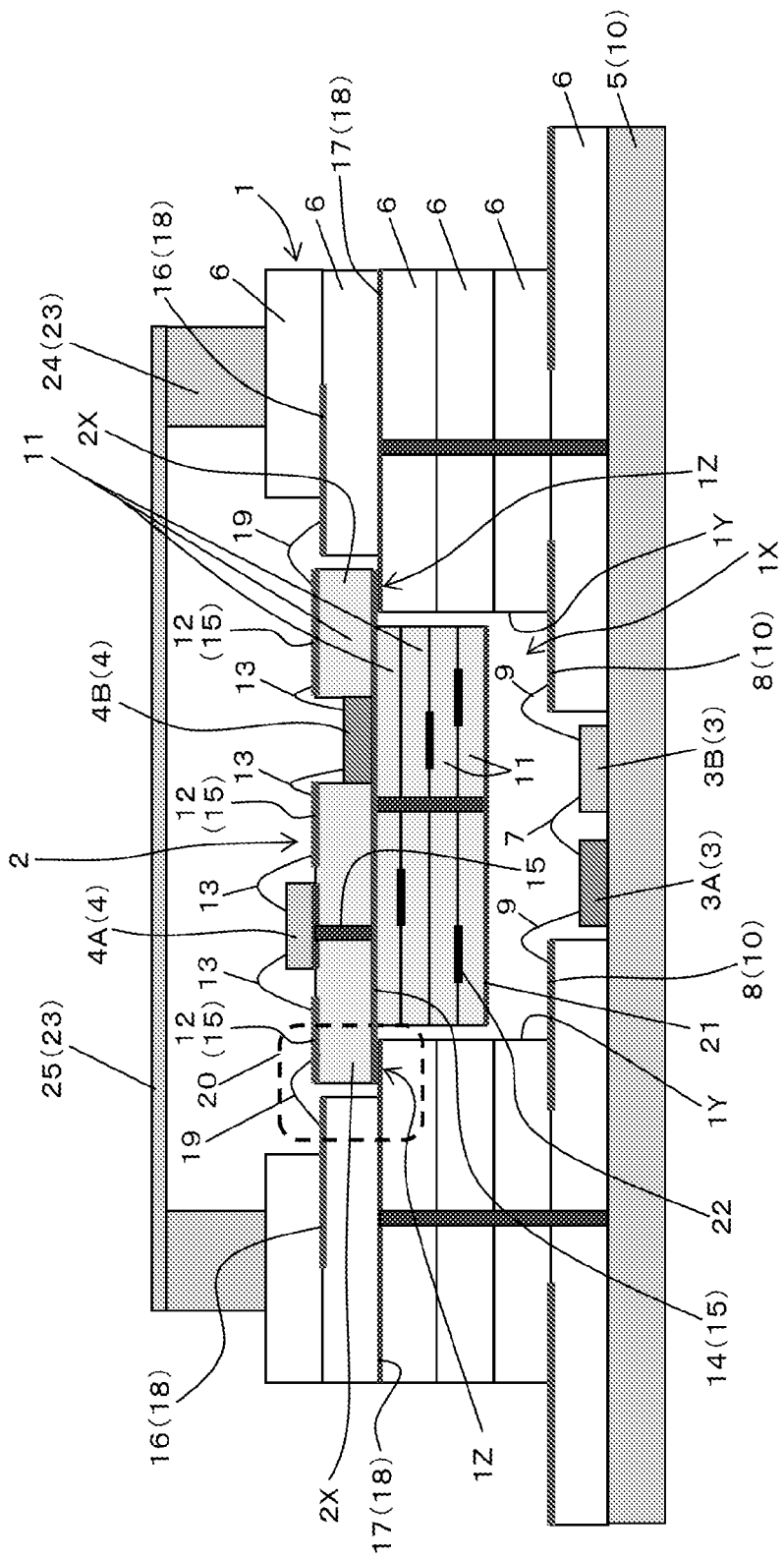
FIG. 1 is a schematic sectional view depicting a configuration of a stacked module according to an embodiment.

As shown in FIG. 1, a stacked module according to the present embodiment is configured by stacking a plurality of (here, two) multilayer substrates 1 and 2 on which semiconductor chips 3 and 4 are mounted. In particular, the stacked module in the present embodiment is configured by stacking a first multilayer substrate 1 on which a first semiconductor chip 3 is mounted and a second multilayer substrate 2 on which a second semiconductor chip 4 is mounted.

It is to be noted that the multilayer substrate is sometimes referred to as multilayer wiring board or stacked substrate. Further, the first multilayer substrate 1 on which the first semiconductor chip 3 is mounted is sometimes referred to as first module, semiconductor circuit module or semiconductor circuit package. Meanwhile, the second multilayer substrate 2 on which the second semiconductor chip 4 is mounted is sometimes referred to as second module, semiconductor circuit module or semiconductor circuit package. Further, each of the multilayer substrates 1 and 2 on which the semiconductor chips 3 and 4 are mounted is sometimes referred to as multichip module.

The stacked module is described below taking a transmission/reception module as an example.

As shown in FIG. 1, the transmission/reception module of the present embodiment is configured by stacking the second multilayer substrate 2 on which a plurality of transmission or reception semiconductor chips are mounted as the second semiconductor chip 4 on the first multilayer substrate 1 on which a plurality of transmission or reception semiconductor chips are mounted as the first semiconductor chip 3. Consequently, miniaturization of the transmission/reception module can be implemented.

Here, the first multilayer substrate 1 is an interconnection substrate (wiring board) that includes interconnections (wiring lines) such as, for example, a signal interconnection, a grounding interconnection and a power supply interconnection, and has a structure in which a plurality of substrates 6 having the interconnections (wirings) on the front face thereof are stacked and the upper and lower interconnections are connected to each other through vias.

In particular, the first multilayer substrate 1 is structured such that a multilayer alumina substrate having a structure in which a plurality of (here, six) alumina substrates 6 having interconnections on the front face thereof are stacked on a metal base 5 made of a metal material such as, for example, CuW. It is to be noted that the alumina substrate 6 is sometimes referred to as ceramics substrate, alumina ceramics substrate or dielectric substrate. Further, the metal base 5 is sometimes referred to as metal plate, heat radiation member or grounding conductor layer. Here, the thickness of the alumina substrates 6 from the lower side to the fifth layer is approximately 0.25 mm and the thickness of the alumina substrate 6 of the sixth layer is approximately 0.38 mm. In this manner, the HTCC technique in which the HTCC substrate 6 is used is adopted for the first multilayer substrate 1 here.

Figure 2:
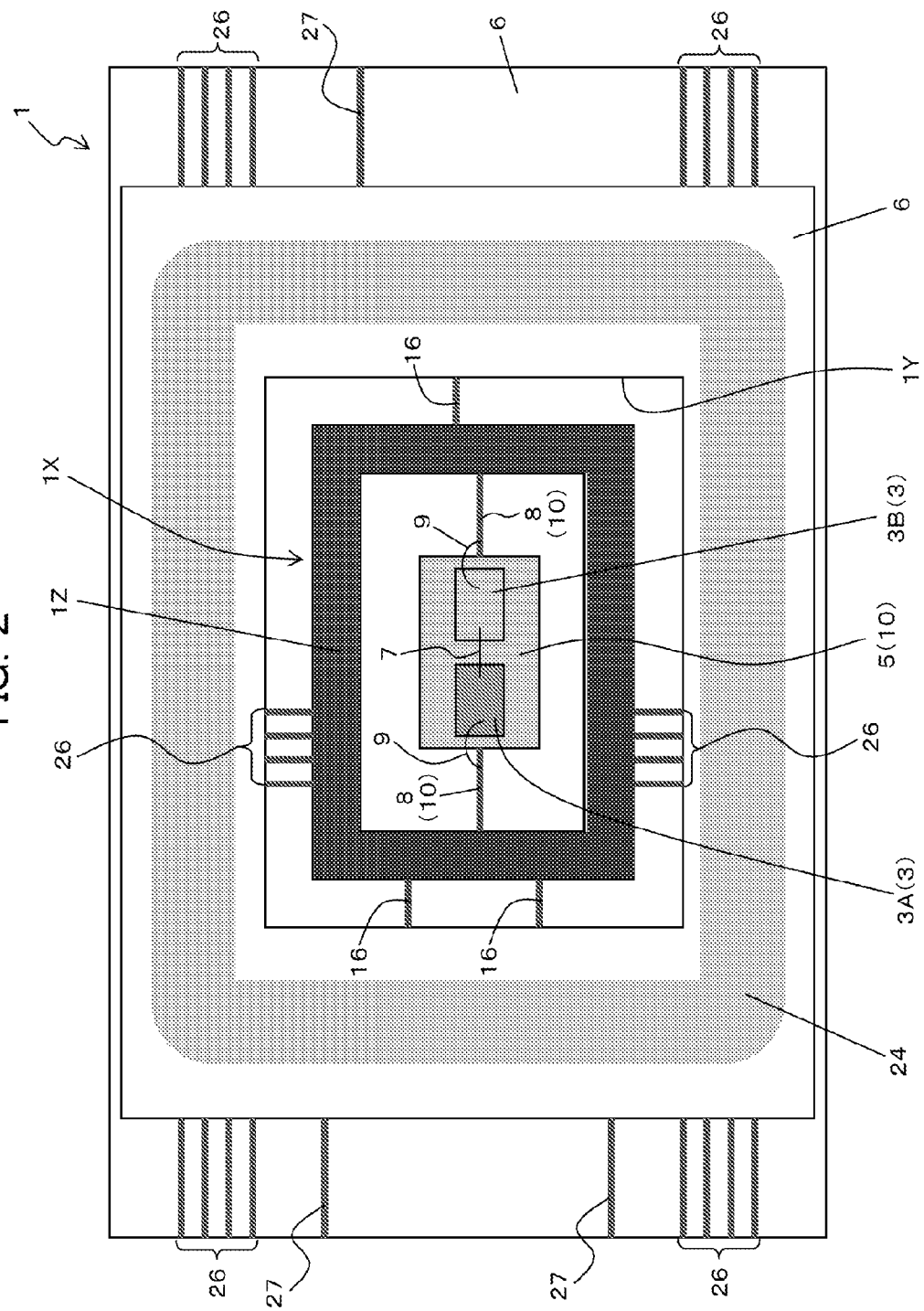
FIG. 2 is a schematic top plan view depicting a configuration of a first multilayer substrate that configures the stacked module according to the embodiment.

Particularly, in the present embodiment, in order to mount the plural transmission or reception semiconductor chips 3 on the first multilayer substrate 1 and further stack the second multilayer substrate 2 as shown in FIGS. 1 and 2, the first multilayer substrate includes an opening 1X for mounting the plural transmission or reception semiconductor chips 3 and the second multilayer substrate 2 therein. The opening 1X has a stepwise wall face 1Y.

In particular, an opening is provided on each of the plural (here, six) alumina substrates 6 that configure the first multilayer substrate 1. The size of the openings provided on the alumina substrates 6 from the second layer to the fourth layer is greater than that of the opening provided on the alumina substrate 6 of the first layer from the lower side. Further, the size of the opening provided on the alumina substrate 6 of the fifth layer is greater than that of the openings provided on the alumina substrates 6 from the second layer to the fourth layer. Further, the size of the opening provided on the alumina substrate 6 of the sixth layer is greater than that of the opening provided on the alumina substrate 6 of the fifth layer. In this manner, the openings having the stepwise wall face 1Y are provided as the opening 1X for mounting the plural transmission or reception semiconductor chips 3 and the second multilayer substrate 2 therein.

Further, the front face of the metal base 5 is exposed on the bottom face in the opening 1X of the first multilayer substrate 1, namely, on the bottom face in the opening provided on the alumina substrate 6 of the first layer from the lower side, and the plural transmission or reception semiconductor chips 3 are mounted on the metal base 5. In other words, the plural transmission or reception semiconductor chips as the first semiconductor chips 3 are mounted on the bottom face in the opening 1X of the first multilayer substrate 1. Here, a driver amplifier 3A and a high-output amplifier 3B from among the plural transmission or reception semiconductor chips 3 that configure the transmission/reception module are configured as MMIC (Monolithic microwave integrated circuit) chips, and the amplifiers 3A and 3B are mounted on the bottom face in the opening 1X of the first multilayer substrate 1. The semiconductor chips 3A and 3B are joined by the solder such as, for example, AuSn to the metal base 5.

The semiconductor chips 3A and 3B are electrically coupled to each other by a wire 7 (wire bonding).

Further, the semiconductor chips 3A and 3B are electrically coupled by wires 9 (wire bonding) to a high-frequency signal interconnection 8 exposed on the upper face of an end portion on the opening side of the alumina substrate 6 of the first layer utilizing the fact that the size of the opening of the alumina substrate 6 of the second layer is greater than that of the opening of the alumina substrate 6 of the first layer from the lower side. In this instance, the metal base 5 functions as a high-frequency grounding interconnection. The semiconductor chips 3A and 3B are electrically coupled to a transmission line 10 that is configured from the high-frequency signal interconnection 8 (line conductor) provided on the front face of the alumina substrate 6 of the first layer and the high-frequency grounding interconnection (grounding conductor layer) configured from the metal base 5 contacting with the back face of the alumina substrate 6 of the first layer in such a manner as described above and that transmits a high-frequency signal. In short, the semiconductor chips 3A and 3B as the first semiconductor chips 3 are electrically coupled to the transmission line 10 provided on the first multilayer substrate 1, namely, to the transmission line 10 provided at a lower portion of the first multilayer substrate 1. It is to be noted that the transmission line 10 is referred to as third transmission line.

Figure 3:
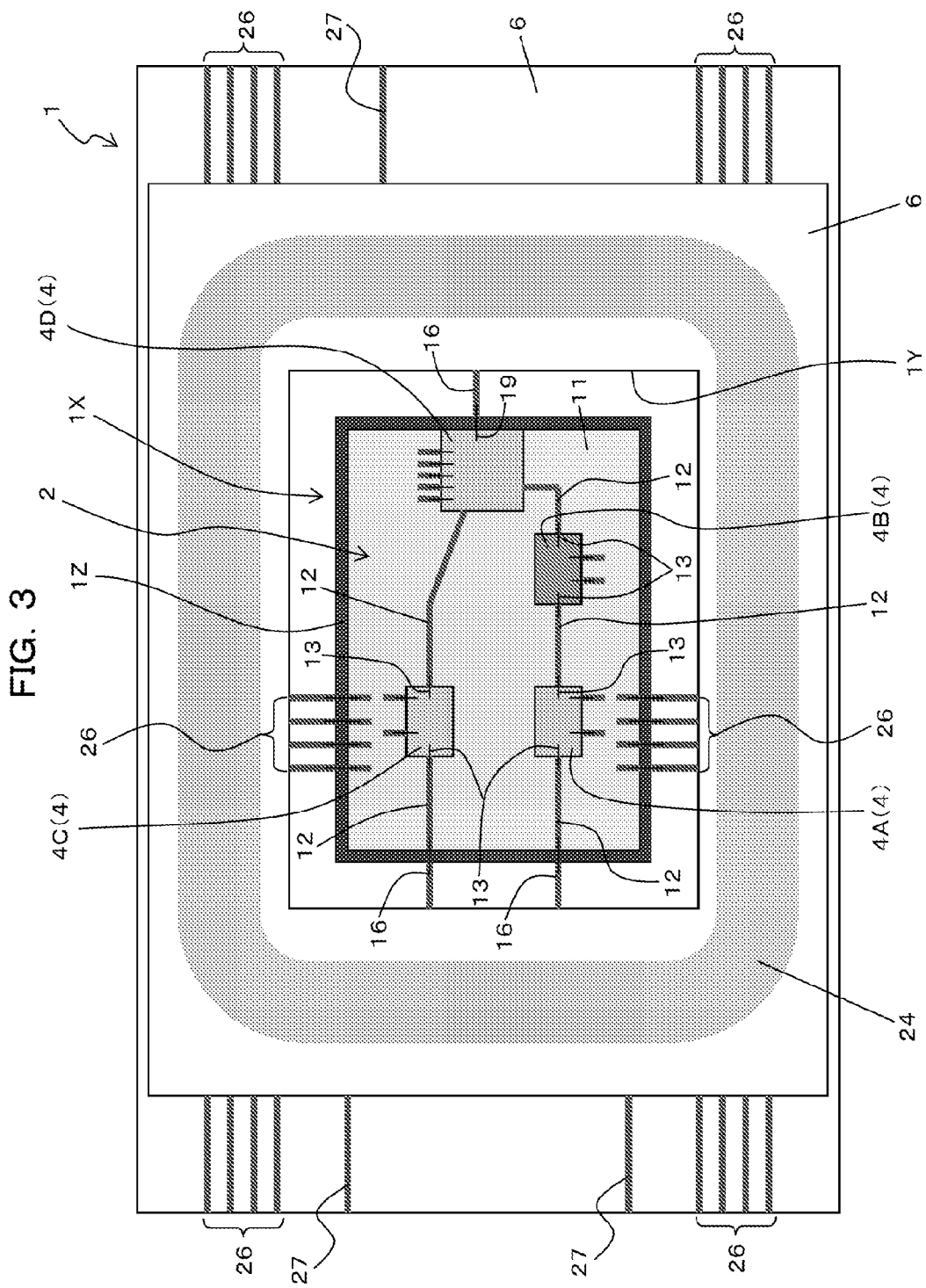
FIG. 3 is a schematic top plan view depicting a configuration of the stacked module according to the embodiment.

Further, the second multilayer substrate 2 is supported on a stepped portion 1Z provided utilizing the fact that the size of the opening of the alumina substrate 6 of the fifth layer is greater than the size of the opening of the alumina substrate 6 of the fourth layer from the lower side, namely, on a stepped portion 1Z provided on the stepwise wall face 1Y of the opening 1X of the first multilayer substrate 1 as shown in FIGS. 1 and 3. In this manner, the second multilayer substrate 2 is mounted in the opening 1X of the first multilayer substrate 1.

Here, the second multilayer substrate 2 is a multilayer alumina substrate structured such that a plurality of (here, five) alumina substrates 11 having interconnections (wiring lines) on the front face thereof are stacked as depicted in FIG. 1. It is to be noted that the alumina substrate 11 is sometimes referred to as ceramics substrate, alumina ceramics substrate or dielectric substrate. Here, the thickness of the alumina substrates 11 to the fourth layer from the lower side is approximately 0.125 mm and the thickness of the alumina substrate 11 of the fifth layer (uppermost layer) is approximately 0.25 mm. In this manner, the HTCC technique using the HTCC substrate 11 is adopted for the second multilayer substrate 2 here.

Further, as shown in FIGS. 1 to 3, a plurality of transmission or reception semiconductor chips 4 are mounted on the front face of the second multilayer substrate 2. In particular, the transmission or reception semiconductor chips as the second semiconductor chips 4 are mounted on the front face of the second multilayer substrate 2. Here, a low-noise amplifier 4A, a high-gain amplifier 4B, a preamplifier 4C and a control circuit 4D from among the transmission or reception semiconductor chips that configure the transmission/reception module are configured as MMIC chips, and the amplifiers just described are mounted on the front face of the second multilayer substrate 2. In particular, the semiconductor chips 4 that function as the low-noise amplifier 4A, preamplifier 4C and control circuit 4D are mounted on the front face of the alumina substrate 11 of the uppermost layer that configures the second multilayer substrate 2, and the semiconductor chip 4 that functions as the high-gain amplifier 4B is mounted on the front face of the alumina substrate 11 of the fourth layer from the lower side.

The semiconductor chips 4A to 4D are electrically coupled by a wire 13 (wire bonding) to a high-frequency signal interconnection 12 exposed on the front face of the second multilayer substrate 2. In particular, the semiconductor chips 4A to 4D are electrically coupled by the wire 13 to the high-frequency signal interconnection 12 provided on the front face of the alumina substrate 11 of the uppermost layer that configures the second multilayer substrate 2.

Here, a high-frequency grounding interconnection 14 is provided on the back face of the alumina substrate 11 of the uppermost layer that configures the second multilayer substrate 2, namely, between the alumina substrate 11 of the uppermost layer and the alumina substrate 11 of the fourth layer from the lower side. The semiconductor chips 4 that function as the low-noise amplifier 4A, preamplifier 4C and control circuit 4D are connected to the high-frequency grounding interconnection 14 through a via 15. Further, the semiconductor chip 4 that functions as the high-gain amplifier 4B is directly connected to the high-frequency grounding interconnection 14.

In this manner, the semiconductor chips 4A to 4D are electrically coupled to the transmission line 15, which is configured from the high-frequency signal interconnection 12 (line conductor) provided on the front face side of the alumina substrate 11 of the uppermost layer that configures the second multilayer substrate 2 and the high-frequency grounding interconnection 14 (grounding conductor layer) provided on the back face side of the alumina substrate 11 of the uppermost layer and which transmits a high-frequency signal. In short, the semiconductor chips 4A to 4D as the second semiconductor chips 4 are electrically coupled to the transmission line 15 provided on the second multilayer substrate 2. It is to be noted that the transmission line 15 is referred to as second transmission line. Further, the line conductor 12 is referred to as second line conductor. Further, the grounding conductor layer 14 is referred to as second grounding conductor layer. Further, the alumina substrate 11 of the uppermost layer is referred to as second substrate.

Further, in the second multilayer substrate 2, as shown in FIG. 1, the size of the alumina substrate 11 of the uppermost layer is greater than that of the alumina substrates 11 to the fourth layer from the lower side and an outer peripheral portion of the alumina substrate 11 of the uppermost layer projects to the outer side than the alumina substrates 11 to the fourth layer from the lower side. In particular, the alumina substrates 11 to the fourth layer from the lower side are provided on an inner side portion of the lower face of the alumina substrate of the uppermost layer. Therefore, the second multilayer substrate 2 has a downwardly convex shape. In this manner, in the present embodiment, the number of layers at the outer peripheral portion of the second multilayer substrate 2 is smaller, and the second multilayer substrate 2 includes a projecting portion 2X formed from a front face side portion (here, the alumina substrate 11 of the uppermost layer) projecting to an outer side than the back face side portion (here, the alumina substrates 11 to the fourth layer from the lower side). Then, the high-frequency grounding interconnection 14 (grounding conductor layer) is exposed on the back face of the projecting portion 2X, namely, on the back face of the outer peripheral portion of the alumina substrate 11 of the uppermost layer. In short, the high-frequency grounding interconnection 14 is exposed on the intermediate portion between the front face and the back face of the second multilayer substrate 2.

Incidentally, a high-frequency signal interconnection 6 (line conductor) provided on the front face side of the alumina substrate 6 of the fifth layer is exposed on the top face at an end portion on the opening side of the alumina substrate 6 of the fifth layer utilizing the fact that the size of the opening of the alumina substrate 6 of the sixth layer is greater than that of the opening of the alumina substrate 6 of the fifth layer from the lower side of the first multilayer substrate 1.

Further, a high-frequency grounding interconnection 17 (grounding conductor layer) provided on the front face side of the alumina substrate 6 of the fourth layer, namely, on the back face side of the alumina substrate 6 of the fifth layer, is exposed on the top face at an end portion on the opening side of the alumina substrate 6 of the fourth layer utilizing the fact that the size of the opening of the alumina substrate 6 of the fifth layer is greater than that of the opening of the alumina substrate 6 of the fourth layer from the lower side of the first multilayer substrate 1. In particular, the high-frequency grounding interconnection 17 is exposed on the surface of the stepped portion 1Z provided by the fact that the size of the opening of the alumina substrate 6 of the fifth layer is greater than that of the opening of the alumina substrate 6 of the fourth layer from the lower side of the first multilayer substrate 1, namely, the surface of the stepped portion 1Z provided on the stepwise wall face 1Y of the opening 1X of the first multilayer substrate 1.

A transmission line 18 for transmitting a high-frequency signal is configured from the high-frequency signal interconnection 16 provided on the front face side of the alumina substrate 6 of the fifth layer from the lower side of the first multilayer substrate 1 and exposed on the top face at an end portion on the opening side of the alumina substrate 6 of the fifth layer, and the high-frequency grounding interconnection 17 provided on the back face side of the alumina substrate 6 of the fifth layer and exposed on the top face at an end portion on the opening side of the alumina substrate 6 of the fourth layer in such a manner as described above. The transmission line 18 is provided at an upper portion of the first multilayer substrate 1. It is to be noted that the transmission line 18 is referred to as first transmission line. Further, the line conductor 16 is referred to as first line conductor. Further, the grounding conductor layer 17 is referred to as first grounding conductor layer. Further, the alumina substrate 6 of the fifth layer from the lower side is referred to as first substrate.

The high-frequency signal interconnection 12 exposed on the front face of the second multilayer substrate 2 and the semiconductor chip 4 that functions as the control circuit 4D are electrically coupled through a wire 19 (wire bonding) to the high-frequency signal interconnection 16 exposed on the top face at the end portion on the opening side of the alumina substrate 6 of the fifth layer from the lower side of the first multilayer substrate 1.

Further, as described above, the second multilayer substrate 2 is supported on the stepped portion 1Z provided on the stepwise wall face 1Y of the opening 1X of the first multilayer substrate 1. The back face of the projecting portion 2X at which the second grounding conductor layer 14 provided on the second multilayer substrate 2 is exposed is joined to the stepped portion 1Z at which the first grounding conductor layer 17 provided on the first multilayer substrate 1 is exposed, and the first grounding conductor layer 17 and the second grounding conductor layer 14 are electrically coupled to each other. Here, the first grounding conductor layer 17 exposed on the surface of the stepped portion 1Z provided on the stepwise wall face 1Y of the opening 1X of the first multilayer substrate 1 and the second grounding conductor layer 14 exposed on the back face of the projecting portion 2X of the second multilayer substrate 2 are solder-joined to each other.

In this manner, in the present embodiment, the first grounding conductor layer 17 that configures the first transmission line 18 provided on the first multilayer substrate 1 and the second grounding conductor layer 14 that configures the second transmission line 15 provided on the second multilayer substrate 2 are directly joined and electrically coupled to each other. Consequently, junction discontinuity (grounding failure) at a connection portion 20 (connection peripheral portion) between the first transmission line 18 provided on the first multilayer substrate 1 and the second transmission line 15 provided on the second multilayer substrate 2 can be eliminated and the grounding continuity can be secured. As a result, transmission loss can be reduced and increase of the bandwidth can be implemented. In other words, reduction of the loss and increase of the bandwidth of the transmission line (transmission characteristic), namely, a wideband and low-loss transmission line, can be implemented. By mounting the second multilayer substrate 2 on the first multilayer substrate 1 to configure the stacked module in this manner, reduction of the loss and increase of the bandwidth can be anticipated and a high-output and small-sized stacked module can be implemented.

Further, in the present embodiment, the first grounding conductor layer 17 exposed on the surface of the stepped portion 1Z provided on the stepwise wall face 1Y of the opening 1X of the first multilayer substrate 1 and the second grounding conductor layer 14 exposed on the back face of the projecting portion 2X of the second multilayer substrate 2 are solder-joined by a solder of, for example, AuSn. In this instance, the range of the grounding conductor layers 17 and 14 exposed at the solder joining portion is limited to the surface of the stepped portion 1Z and the back face of the projecting portion 2X. Therefore, the solder does not at all flow out over a wide range, and uniform and good junction can be carried out. Consequently, the yield can be enhanced. In particular, the mounting yield when the second multilayer substrate 2 is mounted on the first multilayer substrate can be enhanced and a good mounting performance (fabrication performance) can be assured.

Figure 4:
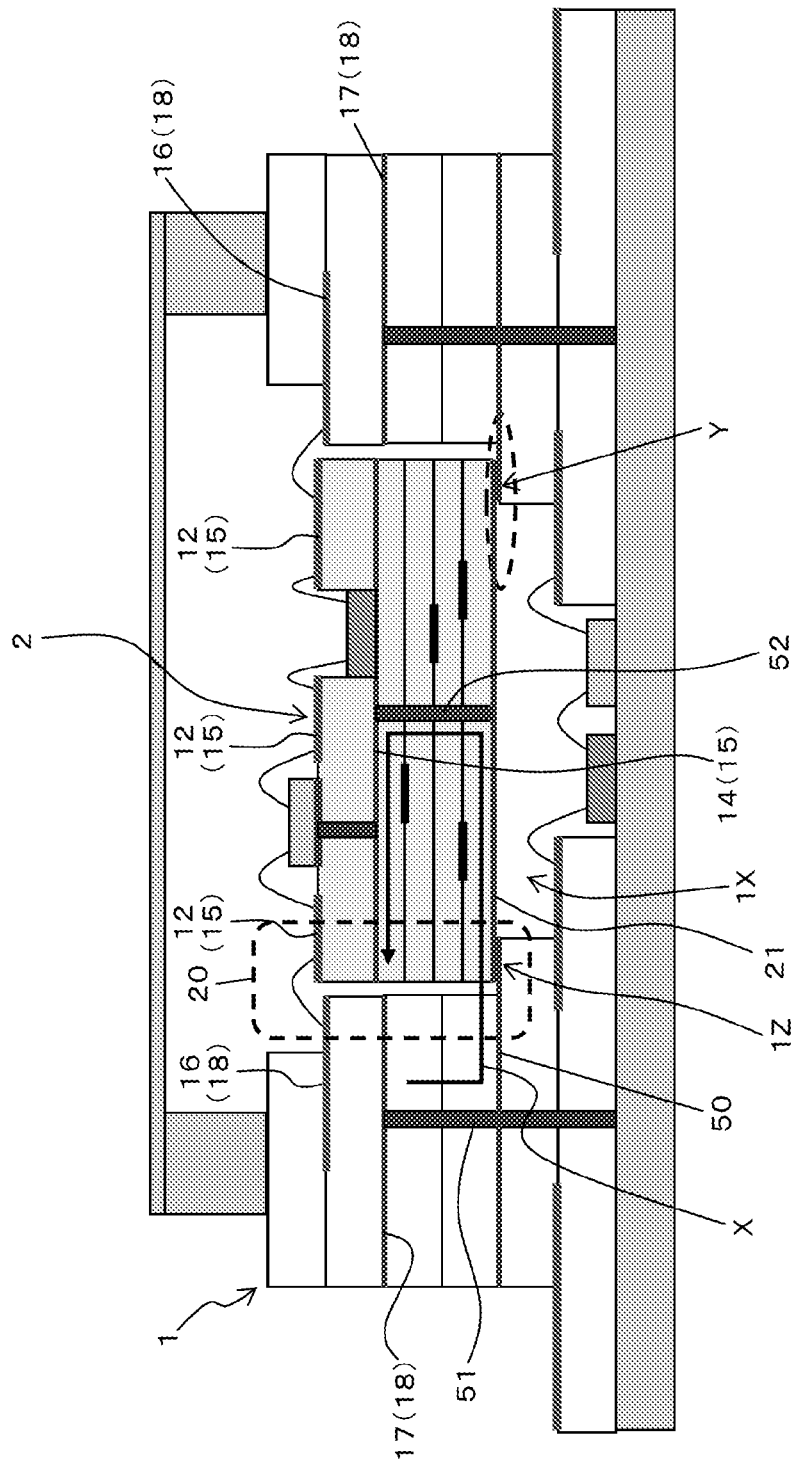
FIG. 4 is a schematic sectional view depicting a configuration of a stacked module of a comparative example.

On the other hand, it is conceivable that, for example, in order to mount the second multilayer substrate 2 in the opening 1X of the first multilayer substrate 1, the stepped portion 1Z is provided at a depthwise position based on the thickness of the second multilayer substrate 2 in the opening 1X of the first multilayer substrate 1 and the second multilayer substrate 2 is supported by the stepped portion 1Z as shown in FIG. 4. Further, it is conceivable to solder-join a grounding conductor layer 21 provided on the overall area of the back face of the second multilayer substrate 2 and a grounding conductor layer 50 exposed on the surface of the stepped portion 1Z using a solder of, for example, AuSn without providing a projecting portion on the second multilayer substrate 2. The configuration just described is hereinafter referred to as stacked module of a comparative example.

In this instance, the grounding conductor layer 50 exposed on the surface of the stepped portion 1Z of the first multilayer substrate 1 is electrically coupled through a via 51 to the grounding conductor layer 17 that configures the transmission line 18 provided on the front face side of the first multilayer substrate 1 for transmitting a high-frequency signal. Further, the grounding conductor layer 21 provided on the back face of the second multilayer substrate 2 is electrically coupled through a via 52 to the grounding conductor layer 14 that configures the transmission line 15 provided on the front face side of the second multilayer substrate 2 for transmitting a high-frequency signal. Therefore, the length of an interconnection for connecting the grounding conductor layer 17 configuring the transmission line 18 provided on the first multilayer substrate 1 and the grounding conductor layer 14 configuring the transmission line 15 provided on the second multilayer substrate 2 becomes long and grounding discontinuity occurs as indicated by an arrow mark X in FIG. 4. Consequently, together with increase of the frequency, transmission loss increases at the connection portion 20 between the transmission line 18 provided on the first multilayer substrate 1 and the transmission line 15 provided on the second multilayer substrate 2. Therefore, it is difficult to implement a high-performance stacked module, namely, a low-loss and wideband stacked module.

Further, in this instance, while the outer peripheral portion of the grounding conductor layer 21 provided on the back face of the second multilayer substrate 2 is solder-joined, the grounding conductor layer 21 is provided over the overall area of the back face of the second multilayer substrate 2. Therefore, upon solder joining, the solder flows over a wide range. Consequently, variation appears in the solder amount at the connection portion indicated by reference character Y in FIG. 4, and it is difficult to achieve a uniform and good junction and the yield drops. In short, it is difficult to assure a mounting yield when the second multilayer substrate 2 is mounted on the first multilayer substrate 1, and it is difficult to assure a good mounting performance (fabrication performance).

Further, in the present embodiment, the grounding conductor layer 21 is provided on the back face of the second multilayer substrate 2 as shown in FIG. 1. Consequently, such a situation that electromagnetic radiation generated from the first semiconductor chip 3, the interconnection and so forth mounted below the second multilayer substrate 2 in the opening 1X of the first multilayer substrate 1 couples to a power supply interconnection 22 or a signal interconnection provided on the second multilayer substrate 2 can be suppressed. Consequently, it is possible to implement stable module operation.

Further, in the present embodiment, the plural transmission or reception semiconductor chips 3 and the opening 1X of the first multilayer substrate 1 in which the second multilayer substrate 2 is mounted are sealed by a metal cavity 23. In particular, as shown in FIGS. 1 and 2, a metal frame 24 for sealing is provided on the alumina substrate 6 of the sixth layer that configures the first multilayer substrate 1, and the metal cover 25 having a size equal to that of the metal frame 24 is joined to the metal frame 24 to implement the sealing described above. Here, the cover 25 having a thickness of approximately 0.3 mm is joined by a solder of, for example, AuSn in a nitrogen atmosphere of approximately 300° C. so that hermetic sealing is implemented. It is to be noted that the inside and the outside sealed in such a manner as described above are connected by a feed-through structure. Further, in FIGS. 2 and 3, reference numeral 26 denotes a power supply interconnection, and reference numeral 27 denotes a high-frequency signal interconnection.

It is to be noted that, since the present transmission/reception module is a module that transmits and receives a high-frequency signal as described above, it is sometimes referred to as high-frequency circuit apparatus, high-frequency circuit package, high-frequency package or wideband high-output microwave circuit package.

Accordingly, with the stacked module according to the present embodiment, there is an advantage that reduction of the loss and increase of the bandwidth can be implemented while miniaturization is implemented.

Figure 5:
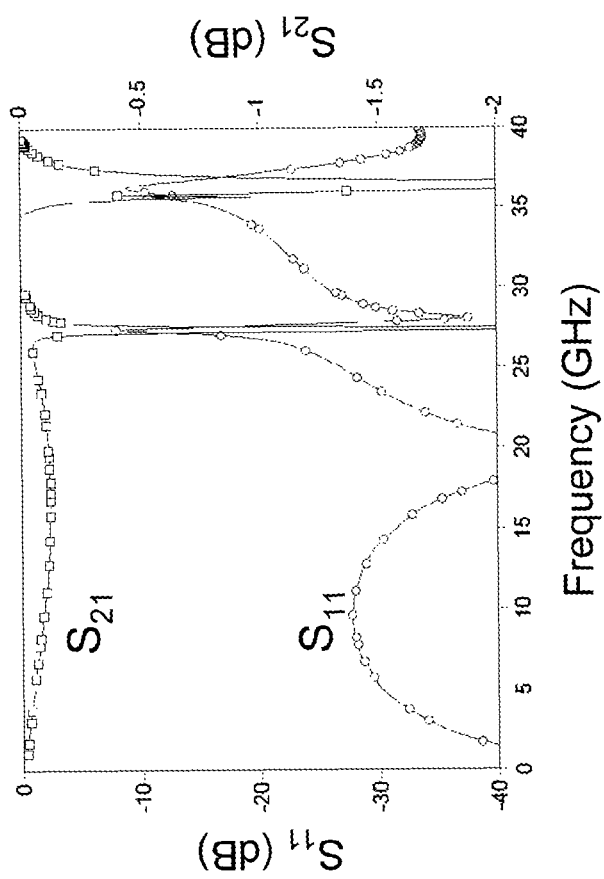
FIG. 5 is a view illustrating a result of an electromagnetic field simulation of the stacked module according to the embodiment.

Here, FIG. 5 illustrates a result of an electromagnetic field simulation of the stacked module of the present embodiment. On the other hand, FIG. 6 illustrates a result of an electromagnetic field simulation of the stacked module of the comparative example (refer to FIG. 4) described hereinabove.

It is to be noted that, in the simulation, a reflection characteristic $S_{11}$ and a pass characteristic $S_{21}$ ware calculated as transmission characteristics of the connection portion 20 between the first multilayer substrate 1 and the second multilayer substrate 2 using the dimensions of the stacked module described in the embodiment given above. In FIGS. 5 and 6, the reflection characteristic $S_{11}$ is indicated by a solid line by plotting of round marks and the pass characteristic $S_{21}$ is indicated by a solid line by plotting of square marks. Further, the characteristics just described were calculated on the assumption that the high-frequency signal interconnection 16 of the first multilayer substrate 1 and the high-frequency signal interconnection 12 of the second multilayer substrate 2 were connected to each other by wire bonding using the wire 19 having a diameter of approximately 25 μm and the high-frequency grounding interconnection 17 (grounding conductor layer) of the first multilayer substrate 1 and the high-frequency grounding interconnection 14 (grounding conductor layer) of the second multilayer substrate 2 were ideally electrically coupled to each other.

Figure 6:
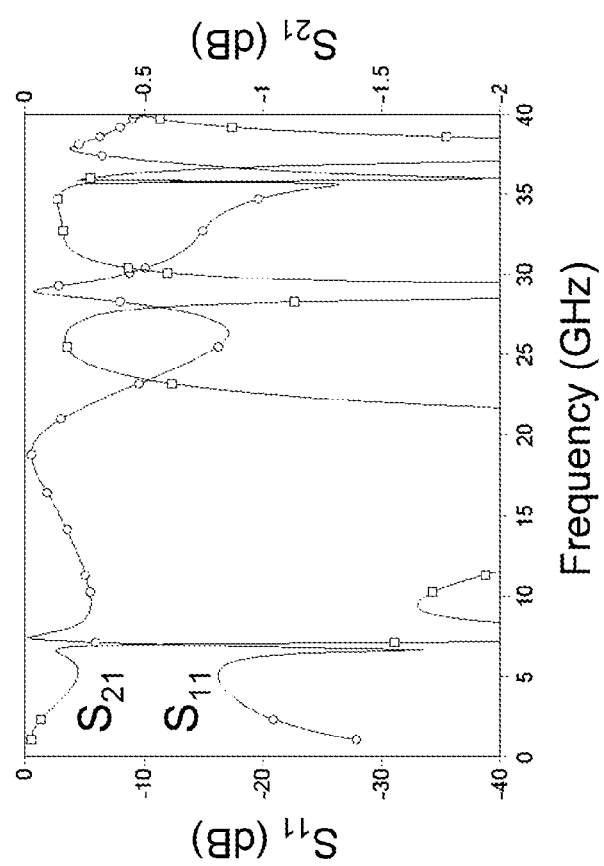
FIG. 6 is a view illustrating a result of an electromagnetic field simulation of the stacked module of the comparative example.

As a result, since, in the stacked module of the comparative example (refer to FIG. 4) described above, grounding discontinuity of the transmission line at the connection portion 20 between the first multilayer substrate 1 and the second multilayer substrate 2 occurred as seen from FIG. 6, the bandwidth within which a good transmission characteristic was obtained was approximately 5 GHz.

In particular, the reflection characteristic $S_{11}$ indicates a ratio of a signal returned by reflection with respect to an input signal, and, if the value (dB) of the ratio approaches 0 dB, then the signal returned by reflection increases and the transmission characteristic degrades. Further, the pass characteristic $S_{21}$ indicates a gain (or loss), and, if the value (dB) of the gain approaches 0 dB, then a good transmission characteristic is maintained. Then, when the reference of degradation of the transmission characteristic was determined to a reflection characteristic of −18 dB, in the stacked module of the comparative example (refer to FIG. 4) described above, the bandwidth within which a good transmission characteristic was obtained was approximately 5 GHz as illustrated in FIG. 6. Further, when approximately 5 GHz was exceeded, the value of the pass characteristic $S_{21}$ came away from 0 dB and the loss increased. In this manner, in the stacked module of the comparative example (refer to FIG. 4) described above, the bandwidth within which a good transmission characteristic was obtained was approximately 5 GHz.

On the other hand, since, in the stacked module of the present embodiment, the grounding continuity of the transmission line at the connection portion 20 between the first multilayer substrate 1 and the second multilayer substrate 2 was assured as illustrated in FIG. 5, the bandwidth within which a good transmission characteristic was obtained was approximately 27 GHz.

In particular, with the stacked module of the present embodiment, it was confirmed that, if the reference of degradation of the transmission characteristic was determined to reflection characteristic −18 dB, then the bandwidth within which a good transmission characteristic was obtained increased to approximately 27 GHz as illustrated in FIG. 5. Further, until the bandwidth reached approximately 27 dB, it was confirmed that the value of the pass characteristic $S_{21}$ was close to 0 dB and the loss was low. In this manner, in the present embodiment, it was confirmed that the bandwidth within which a good transmission characteristic was obtained increased to approximately 27 GHz and reduction of the loss was implemented.

It is to be noted that the present invention is not limited to the embodiment specifically described above, and variations and modifications can be made without departing from the scope of the present invention.

For example, while, in the embodiment described above, the present invention is described taking the stacked module in which the two multilayer substrates 1 and 2 on which the semiconductor chips 3 and 4 are mounted are stacked as an example, the present invention is not limited to this. For example, the present invention can be applied also to a stacked module in which three or more multilayer substrates on which semiconductor chips are mounted are stacked.

Further, while, in the embodiment described, the back face of the projecting portion 2X at which the second grounding conductor layer 14 that configures the second transmission line 15 provided on the second multilayer substrate 2 is exposed is joined to the stepped portion 1Z at which the first grounding conductor layer 17 that configures the first transmission line 18 provided on the first multilayer substrate 1 is exposed, and the first grounding conductor layer 17 and the second grounding conductor layer 14 are directly connected to each other so that the grounding continuity is assured and the reduction of loss and increase of the bandwidth are implemented, the present invention is not limited to this.

In particular, the face on which the second grounding conductor layer or the fourth grounding conductor layer electrically coupled to the second grounding conductor layer is exposed may be joined to the stepped portion at which the first grounding conductor layer, or the third grounding conductor layer provided on the opposite side of the first grounding conductor layer across the substrate on the lower side of the first grounding conductor layer and electrically coupled to the first grounding conductor layer is exposed such that the first grounding conductor layer and the second grounding conductor layer are electrically coupled to each other.

For example, the stacked module of the present invention may be configured as a stacked module having any of such structures of first to fifth modifications as hereinafter described.

First, a first modification is described with reference to FIGS. 7 and 8.

Figure 7:
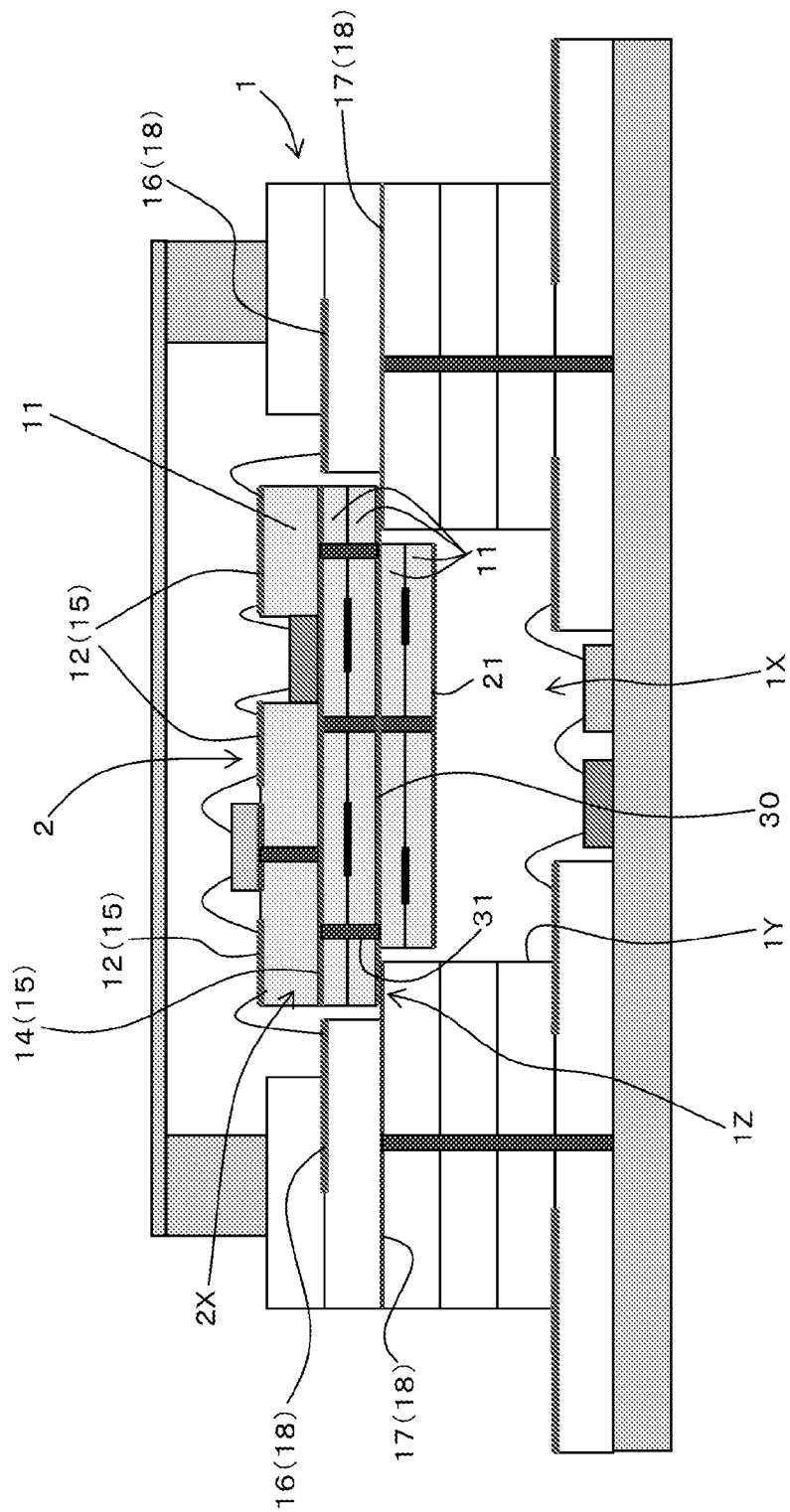
FIG. 7 is a schematic sectional view depicting a configuration of a stacked module according to a first modification.

In the first modification, as illustrated in FIG. 7, the back face of the projecting portion 2X at which the fourth grounding conductor layer 30 electrically coupled to the second grounding conductor layer 14 that configures the second transmission line 15 provided on the second multilayer substrate 2 is exposed is joined to the stepped portion 1Z at which the first grounding conductor layer 17 that configures the first transmission line 18 provided on the first multilayer substrate 1 is exposed, and the first grounding conductor layer 17 and the second grounding conductor layer 14 are electrically coupled to each other.

In this instance, while only the projecting portion 2X of the second multilayer substrate 2 and the grounding conductor layer exposed on the back face of the projecting portion 2X are different from those of the embodiment described above, the configuration of the other part of the first modification are similar to that of the embodiment described above.

In particular, in the second multilayer substrate 2, the size of the three alumina substrates 11 from the upper side is greater than that of the two alumina substrates 11 from the lower side and the outer peripheral portion of the three alumina substrates 11 from the upper side projects to the outer side than that of the two alumina substrates 11 from the lower side. In particular, the two alumina substrates 11 from the lower side are provided in an inner side region of the lower face of the three alumina substrates 11 from the upper side. Therefore, the second multilayer substrate 2 has a downwardly convex shape. In this manner, in the second multilayer substrate 2, the number of layers at the outer peripheral portion is smaller, and the projecting portion 2X having a front face side portion (here, the three alumina substrates 11 from the upper side) projecting to the outer side than a back face side portion (here, the two alumina substrates 11 from the lower side) thereof is provided. Further, on the back face of the projecting portion 2X, namely, on the back face of the outer peripheral portion of the three alumina substrates 11 from the lower side, the grounding interconnection 30 (fourth grounding conductor layer) electrically coupled to the high-frequency grounding interconnection 14 (second grounding conductor layer) through the via 31 is exposed. It is to be noted that the fourth grounding conductor layer 30 is a grounding conductor layer other than the grounding conductor layer that configures the transmission line. Here, the fourth grounding conductor layer 30 is provided on the lower side by two alumina substrates with respect to the second grounding conductor layer 14.

Further, the first grounding conductor layer 17 exposed on the surface of the stepped portion 1Z provided on the stepwise wall face 1Y of the opening 1X of the first multilayer substrate 1 and the fourth grounding conductor layer 30 exposed on the back face of the projecting portion 2X of the second multilayer substrate 2 are solder-joined to each other. In this manner, the back face of the projecting portion 2X at which the fourth grounding conductor layer 30 provided on the second multilayer substrate 2 is exposed is joined to the stepped portion 1Z that is provided on the stepwise wall face 1Y of the opening 1X of the first multilayer substrate 1 and at which the first grounding conductor layer 17 is exposed, and the first grounding conductor layer 17 and the second grounding conductor layer 14 are electrically coupled to each other.

Figure 8:
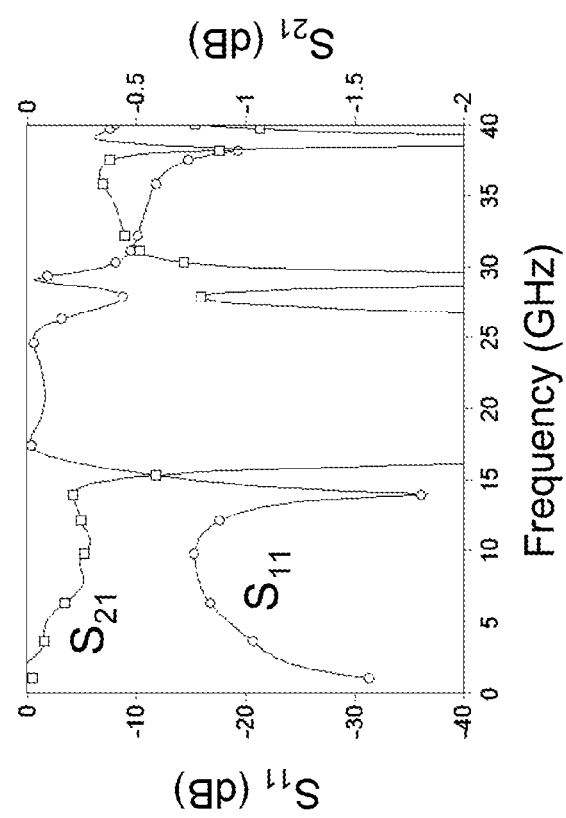
FIG. 8 is a view illustrating a result of an electromagnetic field simulation of the stacked module according to the first modification.

As a result of an electromagnetic simulation carried out for the stacked module of the first modification similarly as in the case of the embodiment described above, since the grounding continuity of the transmission line is assured at the connection portion between the first multilayer substrate 1 and the second multilayer substrate 2 as illustrated in FIG. 8, the bandwidth within which a good transmission characteristic was obtained was approximately 14 GHz. It is to be noted that, in FIG. 8, a reflection characteristic $S_{11}$ and a pass characteristic $S_{21}$ are indicated by a solid line by plotting of round marks and another solid line by plotting of square marks, respectively.

In particular, in the stacked module of the first modification, when the reference of degradation of the transmission characteristic was determined to a reflection characteristic of −18 dB, then it was confirmed that the bandwidth within which a good transmission characteristic was obtained increased to approximately 14 GHz. Further, it was confirmed that, until the bandwidth reached approximately 14 GHz, the value of the pass characteristic $S_{21}$ was close to 0 dB and the loss was suppressed low. In this manner, with the stacked module of the first modification, it was confirmed that the bandwidth within which a good transmission characteristic was obtained increased to approximately 14 GHz and reduction of the loss was achieved.

Now, a second modification is described with reference to FIGS. 9 and 10.

Figure 9:
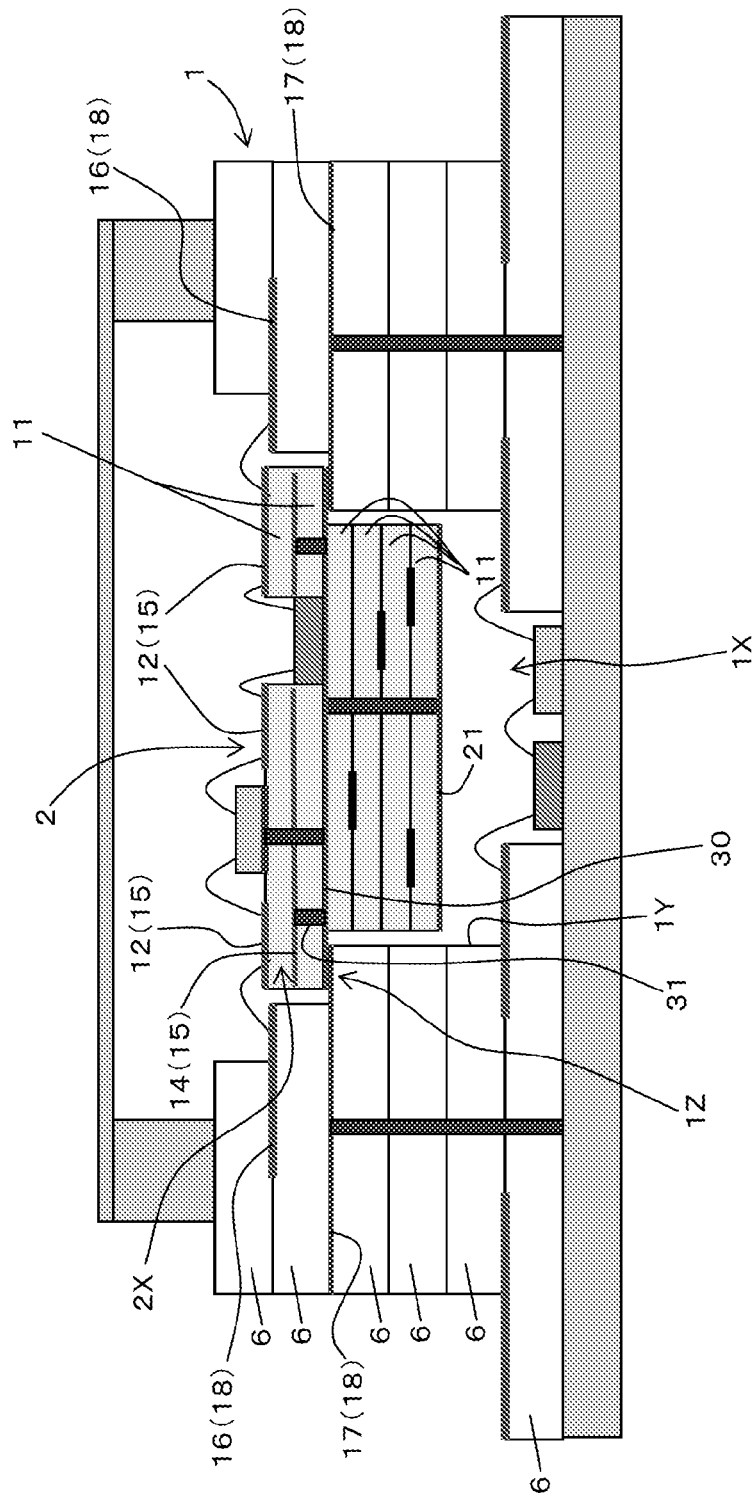
FIG. 9 is a schematic sectional view depicting a configuration of a stacked module according to a second modification.

In the second modification, as illustrated in FIG. 9, the back face of the projecting portion 2X at which the fourth grounding conductor layer 30 electrically coupled to the second grounding conductor layer 14 that configures the second transmission line 15 provided on the second multilayer substrate 2 is exposed is joined to the stepped portion 1Z at which the first grounding conductor layer 17 that configures the first transmission line 18 provided on the first multilayer substrate 1 is exposed, and the first grounding conductor layer 17 and the second grounding conductor layer 14 are electrically coupled to each other similarly as in the first modification described above.

However, in the second modification, the projecting portion 2X of the second multilayer substrate 2 is different from that of the first modification described above. It is to be noted that, while the projecting portion 2X of the second multilayer substrate 2 and the grounding conductor layer exposed on the back face of the projecting portion 2X are different from those of the embodiment described above, the configuration of the other part of the second modification is similar to that of the embodiment described above.

In particular, the second multilayer substrate 2 is structured such that six alumina substrates 11 having a thickness of approximately 0.125 mm are stacked. In particular, while the thickness of the alumina substrate 11 of the fifth layer (uppermost layer) is approximately 0.25 mm in the embodiment and the first modification described above, in the second modification, the alumina substrate 11 of the fifth layer is divided into two layers to form alumina substrates 11 of a fifth layer and a sixth (uppermost) layer that have a thickness of approximately 0.125 mm. Therefore, the transmission line 15 (second transmission line) provided on the second multilayer substrate 2 is configured from the high-frequency signal interconnection 12 (second line conductor) provided on the front face side of the alumina substrate 11 (second substrate) of the sixth (uppermost layer) layer and the high-frequency grounding interconnection 14 (second grounding conductor layer) provided on the back face side of the alumina substrate 11 of the sixth layer. In this instance, the transmission line 18 (first transmission line) provided on the first multilayer substrate 1 is similar to that of the embodiment described above. Therefore, the thickness of the alumina substrate 11 (second substrate) on the front face and the back face of which the transmission lines 15 provided on the second multilayer substrate 2 are provided is smaller than that of the alumina substrate 6 (first substrate) on the front face and the back face of which the transmission lines 18 provided on the first multilayer substrate 1 are provided. Further, the grounding interconnection 30 (fourth grounding conductor layer) other than the grounding interconnection that configures the transmission line is electrically coupled through the via 31 to the back face side of the alumina substrate 11 of the sixth layer, namely, to the high-frequency grounding interconnection 14 (second grounding conductor layer) provided on the front face side of the alumina substrate 11 of the fifth layer. In other words, the grounding wiring line 30 (fourth grounding conductor layer) other than the grounding interconnection that configures the transmission line is provided on the opposite side of the high-frequency grounding interconnection 14 across the alumina substrate 11 of the fifth layer on the lower side of the high-frequency grounding interconnection 14 (second grounding conductor layer) that configures the transmission line 15 (second transmission line) provided on the second multilayer substrate 2. In this manner, the fourth grounding conductor layer 30 is provided on the opposite side of the second grounding conductor layer 14 across the substrate 11 having the thickness smaller than that of the first substrate 6 on the lower side of the second grounding conductor layer 14. In this manner, by reducing the thickness of the alumina substrates 11 of the fifth and sixth layers that configure the second multilayer substrate 2 to provide the second transmission line 15 and the fourth grounding conductor layer, the ground can be reinforced. Therefore, the fourth grounding conductor layer 30 is provided on the lower side by one alumina substrate with respect to the second grounding conductor layer 14.

Further, in the second multilayer substrate 2, the size of the two alumina substrates 11 from the upper side is greater than that of the four alumina substrates 11 from the lower side, and the outer peripheral portion of the two alumina substrates 11 from the upper side projects to the outer side than the four alumina substrates 11 from the lower side. In particular, the four alumina substrates 11 from the lower side are provided at an inner side region of the lower face of the two alumina substrates 11 from the upper side. Therefore, the second multilayer substrate 2 has a downwardly convex shape. In this manner, in the second multilayer substrate 2, the number of layers at the outer peripheral portion is smaller, and the projecting portion 2X whose front face side portion (here, the two alumina substrates 11 from the upper side) projects to the outer side than the back face side portion (here, the four alumina substrates 11 from the lower side) is provided. Further, on the back face of the projecting portion 2X, namely, on the back face of the outer peripheral portion of the two alumina substrates 11 from the upper side, the grounding interconnection 30 (fourth grounding conductor layer) electrically coupled to the high-frequency grounding interconnection 14 (second grounding conductor layer) through the via 31 is exposed.

Further, the first grounding conductor layer 17 exposed on the surface of the stepped portion 1Z provided on the stepwise wall face 1Y of the opening 1X of the first multilayer substrate 1 and the fourth grounding conductor layer 30 exposed on the back face of the projecting portion 2X of the second multilayer substrate 2 are solder-joined to each other. In this manner, the back face of the projecting portion 2X at which the fourth grounding conductor layer 30 provided on the second multilayer substrate 2 is exposed is joined to the stepped portion 1Z that is provided on the stepwise wall face 1Y of the opening 1X of the first multilayer substrate 1 and at which the first grounding conductor layer 17 is exposed, and the first grounding conductor layer 17 and the second grounding conductor layer 14 are electrically coupled to each other.

Figure 10:
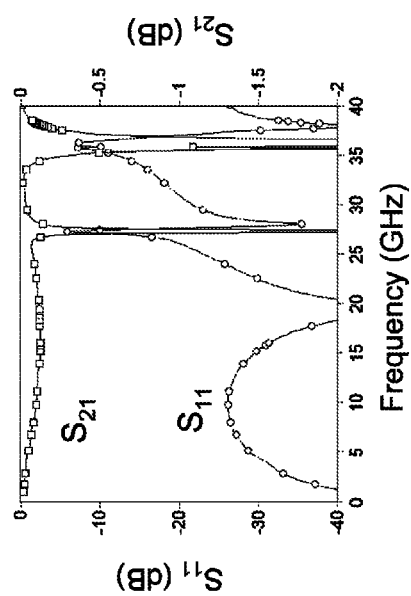
FIG. 10 is a view illustrating a result of an electromagnetic field simulation of the stacked module according to the second modification.

As a result of an electromagnetic simulation carried out for the stacked module of the second modification similarly as in the case of the embodiment described above, since the grounding continuity of the transmission line was assured at the connection portion between the first multilayer substrate 1 and the second multilayer substrate 2 as illustrated in FIG. 10, the bandwidth within which a good transmission characteristic was obtained was approximately 27 GHz. It is to be noted that, in FIG. 10, a reflection characteristic $S_{11}$ and a pass characteristic $S_{21}$ are indicated by plotting of round marks and another solid line by plotting of square marks, respectively.

In particular, in the stacked module of the second modification, when the reference of degradation of the transmission characteristic was determined to a reflection characteristic of −18 dB, it was confirmed that the bandwidth within which a good transmission characteristic was obtained increased to approximately 27 GHz. Further, it was confirmed that, until the bandwidth reached approximately 27 GHz, the value of the pass characteristic $S_{21}$ was close to 0 dB and the loss was suppressed low. In this manner, with the stacked module of the second modification, it was confirmed that the bandwidth within which a good transmission characteristic was obtained increased to approximately 27 GHz and reduction of the loss was achieved.

Now, a third modification is described with reference to FIGS. 11 to 12.

Figure 11:
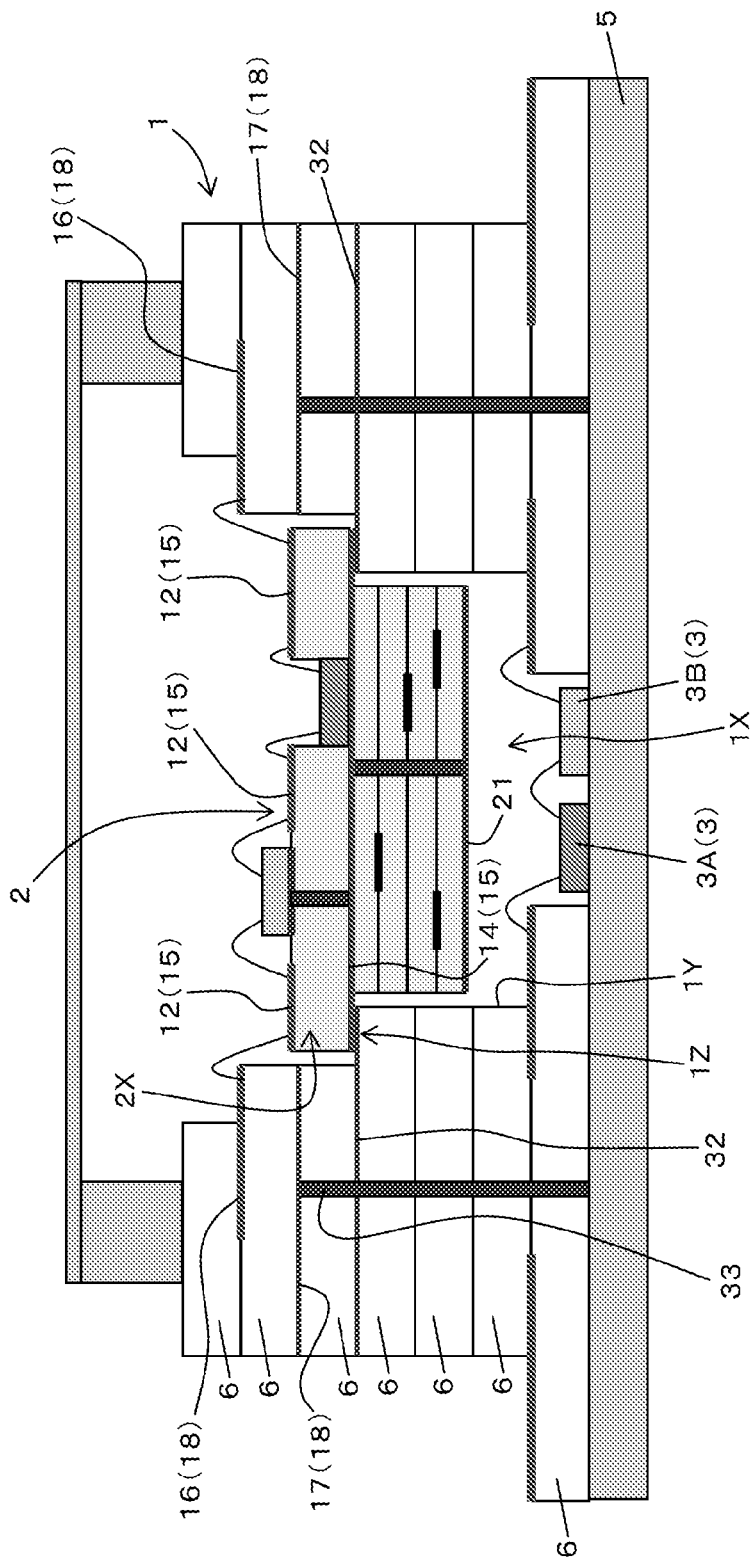
FIG. 11 is a schematic sectional view depicting a configuration of a stacked module according to a third modification.

In the third modification, as illustrated in FIG. 11, the back face of the projecting portion 2X at which the second grounding conductor layer 14 that configures the second transmission line 15 provided on the second multilayer substrate 2 is exposed is joined to the stepped portion 1Z that is provided on the opposite side of the first grounding conductor layer 17 across the substrate 6 on the lower side of the first grounding conductor layer 17 configuring the first transmission line 18 provided on the first multilayer substrate 1 and at which the third grounding conductor layer 32 electrically coupled to the first grounding conductor layer 17 is exposed, and the first grounding conductor layer 17 and the second grounding conductor layer 14 are electrically coupled to each other.

In this instance, while the stepped portion 1Z of the first multilayer substrate 1 and the grounding conductor layer exposed on the surface of the stepped portion 1Z are different from those of the embodiment described above, the configuration of the other part of the third modification is similar to that of the embodiment described above.

In particular, the first multilayer substrate 1 is structured such that a multilayer alumina substrate having a structure in which a plurality of (here, seven) alumina substrates 6 are stacked on the metal base 5 is provided, and the thickness of the alumina substrates 6 to the sixth layer from the lower side is approximately 0.25 mm and the thickness of the alumina substrate 6 of the seventh layer is approximately 0.38 mm.

Further, an opening is provided individually on the plural (here, seven) alumina substrates 6 that configure the first multilayer substrate 1. The size of the openings provided on the alumina substrates 6 from the second layer to the fourth layer is greater than that of the opening provided on the alumina substrate 6 of the first layer from the lower side. Further, the size of the openings provided on the alumina substrates 6 of the fifth and the sixth layers is greater than that of the openings provided on the alumina substrates 6 from the second layer to the fourth layer. Further, the size of the opening provided on the alumina substrate 6 of the seventh layer is greater than that of the openings provided on the alumina substrates 6 of the fifth and sixth layers. In this manner, the opening 1X having the stepwise wall face 1Y is provided as an opening for mounting a plurality of transmission or reception semiconductor chips 3 and the second multilayer substrate 2 therein.

Further, since the size of the opening of the alumina substrate 6 of the seventh layer is greater than that of the opening of the alumina substrate 6 of the sixth layer from the lower side of the first multilayer substrate 1, the high-frequency signal interconnection 16 (first line conductor) provided on the front face side of the alumina substrate 6 of the sixth layer is exposed on the top face at an end portion on the opening side of the alumina substrate of the sixth layer. Further, the high-frequency grounding interconnection 17 (first grounding conductor layer) is provided on the front face side of the alumina substrate 6 of the fifth layer from the lower side of the first multilayer substrate 1, namely, on the back face side of the alumina substrate 6 of the sixth layer. In this manner, the transmission line 18 (first transmission line) for transmitting a high-frequency signal therealong is configured from the high-frequency signal interconnection 16 (first line conductor) provided on the front face side of the alumina substrate 6 (first substrate) of the sixth layer and exposed on the top face at the end portion on the opening side of the alumina substrate 6 of the sixth layer and the high-frequency grounding interconnection 17 (first grounding conductor layer) provided on the back face side of the alumina substrate 6 of the sixth layer.

Further, the grounding interconnection 32 (third grounding conductor layer) electrically coupled through a via 33 to the high-frequency grounding interconnection 17 (first grounding conductor layer) is provided on the front face side of the alumina substrate 6 of the fourth layer from the lower side of the first multilayer substrate 1, namely, on the back face side of the alumina substrate 6 of the fifth layer. In particular, the grounding interconnection 32 (third grounding conductor layer) electrically coupled to the high-frequency grounding interconnection 17 (first grounding conductor layer) is provided on the opposite side of the high-frequency grounding interconnection 17 across the alumina substrate 6 of the fifth layer on the lower side of the high-frequency grounding interconnection 17 (first grounding conductor layer). Then, since the size of the openings of the alumina substrate 6 of the fifth layer is greater than that of the opening of the alumina substrate 6 of the fourth layer from the lower side of the first multilayer substrate 1, the grounding interconnection 32 (third grounding conductor layer) provided on the front face side of the alumina substrate 6 of the fourth layer, namely, on the back face side of the alumina substrate 6 of the fifth layer, is exposed on the top face at an end portion on the opening side of the alumina substrate 6 of the fourth layer. In particular, the grounding interconnection 32 (third grounding conductor layer) electrically coupled to the high-frequency grounding interconnection 17 (first grounding conductor layer) is exposed on the surface of the stepped portion 1Z provided utilizing the size of the opening of the alumina substrate 6 of the fifth layer greater than the size of the opening of the alumina substrate 6 of the fourth layer from the lower side of the first multilayer substrate 1, namely, on the surface of the stepped portion 1Z provided on the stepwise wall face 1Y of the opening 1X of the first multilayer substrate 1. It is to be noted that the third grounding conductor layer 32 is a grounding conductor layer other than the grounding conductor layer that configures the transmission line. Here, the third grounding conductor layer 32 is provided on the lower side by one alumina substrate with respect to the first grounding conductor layer 17.

Further, the third grounding conductor layer 32 exposed on the surface of the stepped portion 1Z provided on the stepwise wall face 1Y of the opening 1X of the first multilayer substrate 1 and the second grounding conductor layer 14 exposed on the back face of the projecting portion 2X of the second multilayer substrate 2 are solder-joined to each other. In this manner, the back face of the projecting portion 2X at which the second grounding conductor layer 14 provided on the second multilayer substrate 2 is exposed is joined to the stepped portion 1Z that is provided on the stepwise wall face 1Y of the opening 1X of the first multilayer substrate 1 and at which the third grounding conductor layer 32 is exposed, and the first grounding conductor layer 17 and the second grounding conductor layer 14 are electrically coupled to each other.

Figure 12:
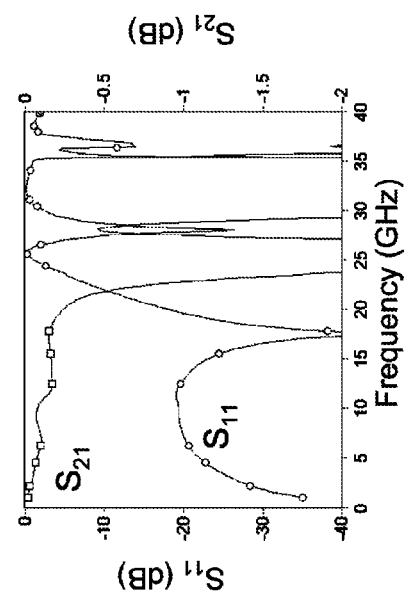
FIG. 12 is a view illustrating a result of an electromagnetic field simulation of the stacked module according to the third modification.

As a result of an electromagnetic simulation carried out for the stacked module of the third modification similarly as in the case of the embodiment described above, since the grounding continuity of the transmission line was assured at the connection portion between the first multilayer substrate 1 and the second multilayer substrate 2 as illustrated in FIG. 12, the bandwidth within which a good transmission characteristic was obtained was approximately 18 GHz. It is to be noted that, in FIG. 12, a reflection characteristic $S_{11}$ and a pass characteristic $S_{21}$ are indicated by a solid line by plotting of round marks and another solid line by plotting of square marks, respectively.

In particular, in the stacked module of the third modification, when the reference of degradation of the transmission characteristic was determined to a reflection characteristic of −18 dB, it was confirmed that the bandwidth within which a good transmission characteristic was obtained increased to approximately 18 GHz. Further, it was confirmed that, until the bandwidth reaches approximately 18 GHz, the value of the pass characteristic $S_{21}$ was close to 0 dB and the loss was suppressed low. In this manner, with the stacked module of the third modification, it was confirmed that the bandwidth within which a good transmission characteristic was obtained increased to approximately 18 GHz and reduction of the loss was achieved.

Now, a fourth modification is described with reference to FIGS. 13 and 14.

Figure 13:
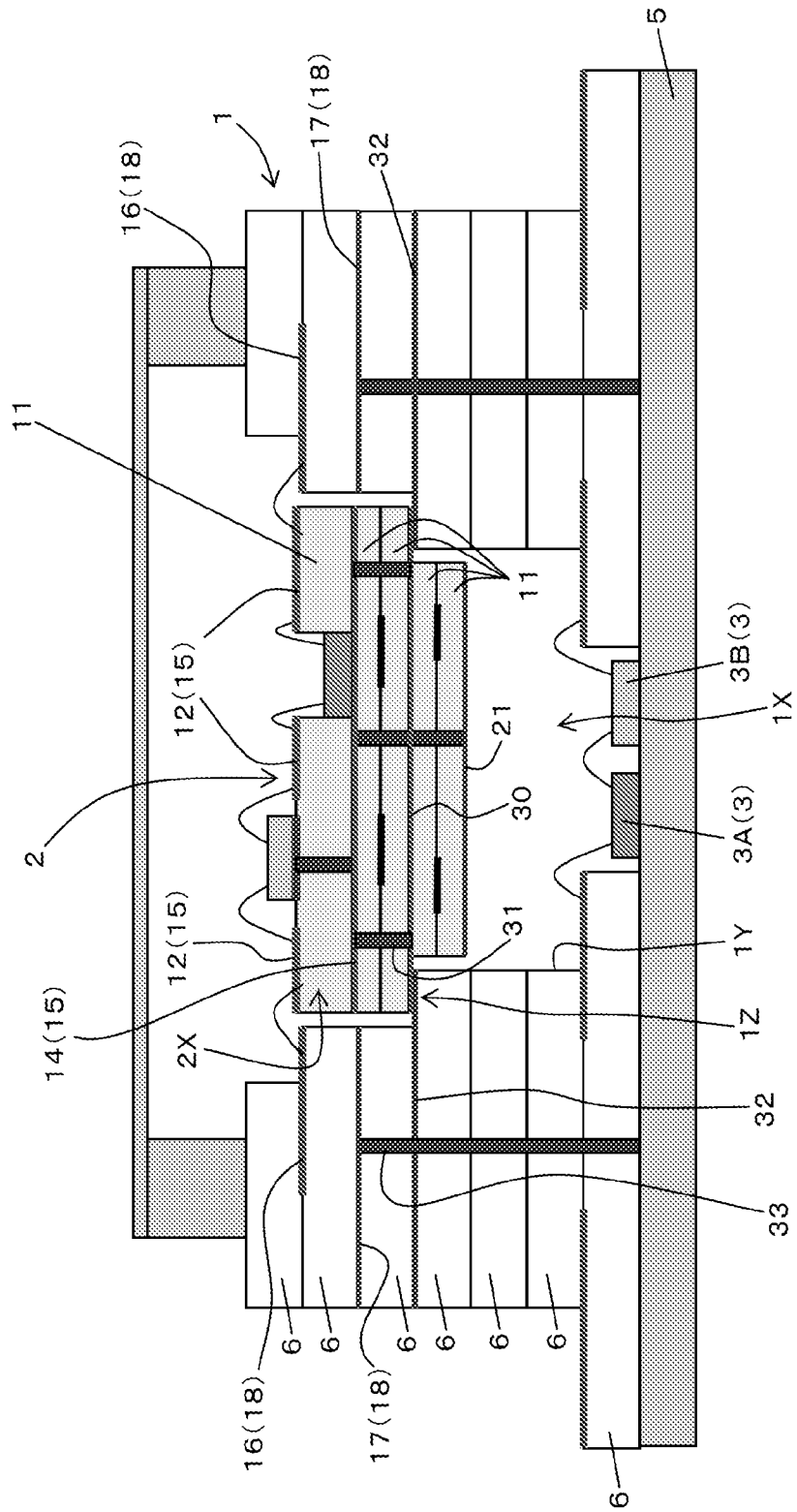
FIG. 13 is a schematic sectional view depicting a configuration of a stacked module according to a fourth modification.

In the fourth modification, as illustrated in FIG. 13, the back face of the projecting portion 2X at which the fourth grounding conductor layer 30 electrically coupled to the second grounding conductor layer 14 configuring the second transmission line 15 provided on the second multilayer substrate 2 is exposed is joined to the stepped portion 1Z at which the third grounding conductor layer 32 electrically coupled to the first grounding conductor layer 17 configuring the first transmission line 18 provided on the first multilayer substrate 1 is exposed, and the first grounding conductor layer 17 and the second grounding conductor layer 14 are electrically coupled to each other.

In particular, in the fourth modification, the stacked module is configured by stacking the first multilayer substrate 1 of the third modification and the second multilayer substrate 2 of the first modification. Therefore, the configuration of the first multilayer substrate 1 is similar to that of the third modification described hereinabove and the configuration of the second multilayer substrate 2 is similar to that of the first modification described hereinabove.

Therefore, the grounding interconnection 32 (third grounding conductor layer) provided on the opposite side of the high-frequency grounding interconnection 17 across the alumina substrate 6 of the fifth layer on the lower side of the high-frequency grounding interconnection (first grounding conductor layer) and electrically coupled through the via 33 to the high-frequency grounding interconnection 17 (first grounding conductor layer) is exposed on the surface of the stepped portion 1Z provided utilizing the size of the opening of the alumina substrate 6 of the fifth layer greater than the size of the opening of the alumina substrate 6 of the fourth layer from the lower side of the first multilayer substrate 1, namely, on the surface of the stepped portion 1Z provided on the stepwise wall face 1Y of the opening 1X of the first multilayer substrate 1. It is to be noted that the third grounding conductor layer 32 is a grounding conductor layer other than the grounding conductor layer that configures the transmission line. Here, the third grounding conductor layer 32 is provided on the lower side by one alumina substrate with respect to the first grounding conductor layer 17.

Further, the grounding interconnection 30 (fourth grounding conductor layer) electrically coupled through the via 31 to the high-frequency grounding interconnection 14 (second grounding conductor layer) is exposed on the back face of the projecting portion 2X of the second multilayer substrate 2, namely, on the back face of the outer peripheral portion of the alumina substrate 11 of the third layer from the lower side. It is to be noted that the fourth grounding conductor layer 30 is a grounding conductor layer other than the grounding conductor layer that configures the transmission line. Here, the fourth grounding conductor layer 30 is provided on the lower side by two alumina substrates with respect to the second grounding conductor layer 14.

Further, the third grounding conductor layer 32 exposed on the surface of the stepped portion 1Z provided on the stepwise wall face 1Y of the opening 1X of the first multilayer substrate 1 and the fourth grounding conductor layer 30 exposed on the back face of the projecting portion 2X of the second multilayer substrate 2 are solder-joined to each other. In this manner, the back face of the projecting portion 2X at which the fourth grounding conductor layer 30 provided on the second multilayer substrate 2 is exposed is joined to the stepped portion 1Z that is provided on the stepwise wall face 1Y of the opening 1X of the first multilayer substrate 1 and at which the third grounding conductor layer 32 is exposed, and the first grounding conductor layer 17 and the second grounding conductor layer 14 are electrically coupled to each other.

Figure 14:
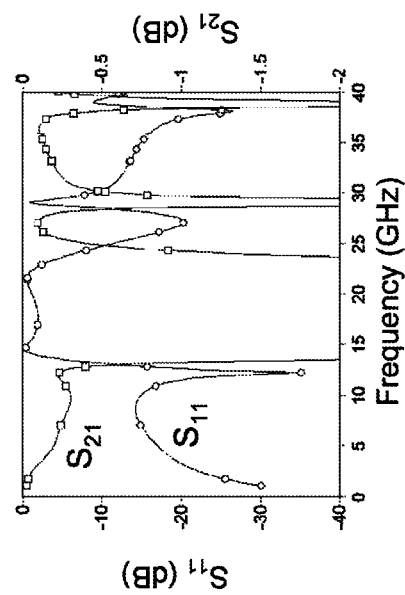
FIG. 14 is a view illustrating a result of an electromagnetic field simulation of the stacked module according to the fourth modification.

As a result of an electromagnetic simulation carried out for the stacked module of the fourth modification similarly as in the case of the embodiment described above, since the grounding continuity of the transmission line was assured at the connection portion between the first multilayer substrate 1 and the second multilayer substrate 2 as illustrated in FIG. 14, the bandwidth within which a good transmission characteristic was obtained was approximately 12 GHz. It is to be noted that, in FIG. 14, a reflection characteristic $S_{11}$ and a pass characteristic $S_{21}$ are indicated by a solid line by plotting of round marks and another solid line by plotting of square marks, respectively.

In particular, in the stacked module of the fourth modification, when the reference of degradation of the transmission characteristic was determined to a reflection characteristic of −18 dB, it was confirmed that the bandwidth within which a good transmission characteristic was obtained increased to approximately 12 GHz. Further, it was confirmed that, until the bandwidth reached approximately 12 GHz, the value of the pass characteristic $S_{21}$ was close to 0 dB and the loss was suppressed low. In this manner, with the stacked module of the fourth modification, it was confirmed that the bandwidth within which a good transmission characteristic was obtained increased to approximately 12 GHz and reduction of the loss was achieved.

Now, a fifth modification is described with reference to FIGS. 15 and 16.

Figure 15:
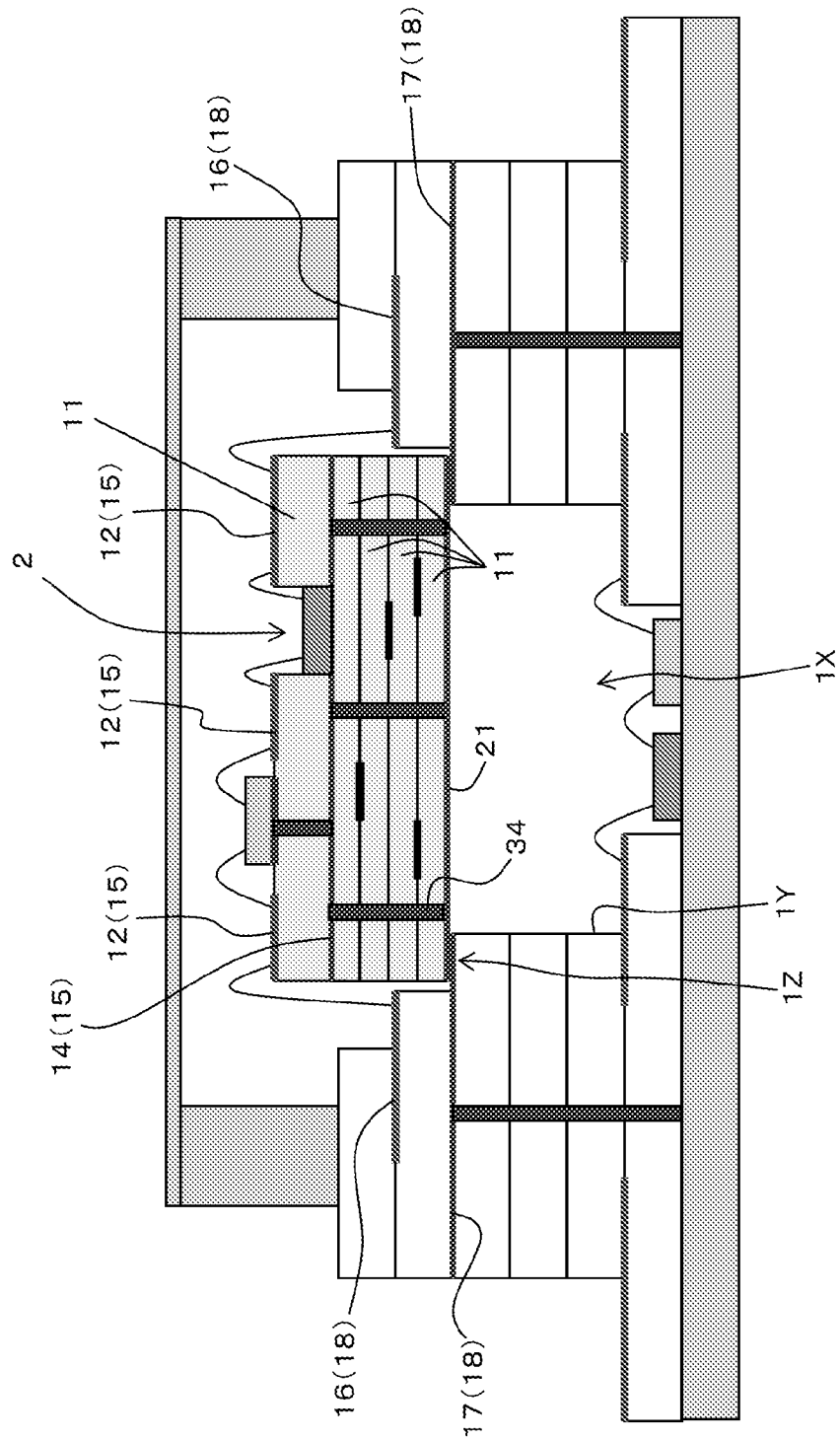
FIG. 15 is a schematic sectional view depicting a configuration of a stacked module according to a fifth modification.

In the fifth modification, as illustrated in FIG. 15, the back face of the second multilayer substrate 2 at which the grounding conductor layer (fourth grounding conductor layer) 21 electrically coupled to the second grounding conductor layer 14 configuring the second transmission line 15 provided on the second multilayer substrate 2 is exposed is joined to the stepped portion 1Z at which the first grounding conductor layer 17 configuring the first transmission line 18 provided on the first multilayer substrate 1 is exposed, and the first grounding conductor layer 17 and the second grounding conductor layer 14 are electrically coupled to each other.

In particular, while, in the first to forth modifications described above, the face on which the second grounding conductor layer 14 or the fourth grounding conductor layer 30 is exposed is the back face of the projecting portion 2X, in the fifth modification, the face on which the grounding conductor layer 21 as the fourth grounding conductor layer is exposed is the back face of the second multilayer substrate 2.

Further, while it is different from the embodiment that the projecting portion is not provided on the second multilayer substrate 2, the configuration of the other part is similar to that of the embodiment described above.

In particular, the second multilayer substrate 2 is structures such that the five alumina substrates 11 are stacked and the projecting portion is not provided. Further, the grounding conductor layer 21 (fourth grounding conductor layer) is provided on the overall area of the back face of the second multilayer substrate 2, namely, on the overall area of the back face of the alumina substrate 11 of the first layer (lowermost layer) from the lower side. Further, the grounding conductor layer 21 is electrically coupled to the high-frequency grounding interconnection 14 (second grounding conductor layer) that configures the transmission line 15 (second transmission line) provided on the second multilayer substrate 2 through a via 34. It is to be noted that the grounding conductor layer 21 as the fourth grounding conductor layer is a grounding conductor layer other than the grounding conductor layer that configures the transmission line. Here, the grounding conductor layer 21 as the fourth grounding conductor layer is provided on the lower side by four alumina substrates with respect to the second grounding conductor layer 14.

Further, the first grounding conductor layer 17 exposed on the surface of the stepped portion 1Z provided on the stepwise wall face 1Y of the opening 1X of the first multilayer substrate 1 and the grounding conductor layer 21 as the fourth grounding conductor layer exposed on the back face of the second multilayer substrate 2 are solder-joined to each other. In this manner, the back face of the second multilayer substrate 2 on which the grounding conductor layer 21 as the fourth grounding conductor layer is exposed is joined to the stepped portion 1Z that is provided on the stepwise wall face 1Y of the opening 1X of the first multilayer substrate 1 and at which the first grounding conductor layer 17 is exposed, and the first grounding conductor layer 17 and the second grounding conductor layer 14 are electrically coupled to each other.

Figure 16:
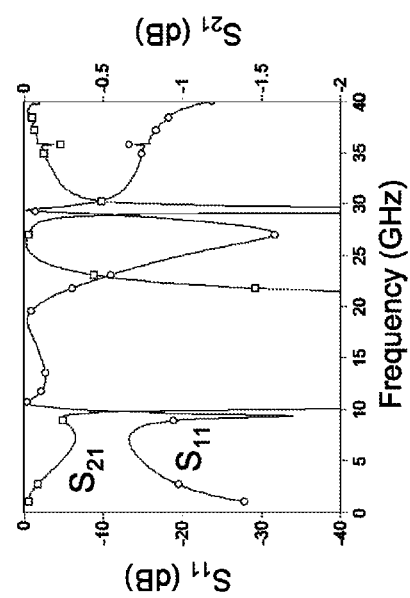
FIG. 16 is a view illustrating a result of an electromagnetic field simulation of the stacked module according to the fifth modification.

As a result of an electromagnetic simulation carried out for the stacked module of the fifth modification similarly as in the case of the embodiment described above, since the grounding continuity of the transmission line was secured at the connection portion between the first multilayer substrate 1 and the second multilayer substrate 2 as illustrated in FIG. 16, the bandwidth within which a good transmission characteristic was obtained was approximately 7 GHz. It is to be noted that, in FIG. 16, a reflection characteristic $S_{11}$ and a pass characteristic $S_{21}$ are indicated by a solid line by plotting of round marks and another solid line by plotting of square marks, respectively.

In particular, in the stacked module of the fifth modification, when the reference of degradation of the transmission characteristic was determined to a reflection characteristic of −18 dB, it was confirmed that the bandwidth within which a good transmission characteristic was obtained increased to approximately 7 GHz. Further, it was confirmed that, until the bandwidth reached approximately 7 GHz, the value of the pass characteristic $S_{21}$ was close to 0 dB and the loss was suppressed low. In this manner, with the stacked module of the fifth modification, it was confirmed that the bandwidth within which a good transmission characteristic was obtained increased to approximately 7 GHz and reduction of the loss was achieved.

In this manner, by configuring the stacked module having any of such structures of the first to fifth modifications as described above, similarly as in the embodiment described above, the length of the interconnection for connecting the first grounding conductor layer 17 that configures the first transmission line 18 provided on the first multilayer substrate 1 and the second grounding conductor layer 14 that configures the second transmission line 15 provided on the second multilayer substrate 2 can be made short in comparison with the stacked module of the comparative example (refer to FIG. 4) described hereinabove. Consequently, the grounding continuity can be assured and reduction of the loss and increase of the bandwidth can be implemented.

Further, while, for example, in the embodiment described hereinabove, the first multilayer substrate 1 and the second multilayer substrate 2 are configured as multilayer alumina substrates (multilayer ceramics substrates) in which alumina substrates are stacked, the present invention is not limited to this, and the first and second multilayer substrates 1 and 2 may be configured, for example, as multilayer glass substrates (multilayer ceramics substrates) in which glass substrates are stacked. In short, while, in the embodiment described above, the HTCC technique using the HTCC substrate is used, the present invention is not limited to this, and, for example, the LTCC technique using the LTCC substrate may be used.

Further, while, for example, in the embodiment described hereinabove, the description is given taking a case in which MMIC chips (functional devices) are mounted on the first multilayer substrate 1 and the second multilayer substrate 2 as an example, the present invention is not limited to this. In particular, only it is necessary for semiconductor chips to be mounted on the first multilayer substrate and the second multilayer substrate. For example, as the semiconductor chip, a different integrated chip such as, for example, a hybrid IC chip configured from a transistor chip and a matching circuit board may be mounted.

Further, while, for example, in the embodiment described hereinabove, the description is given taking a case in which CuW is used as a material of the metal base 5 as an example, the present invention is not limited to this. In particular, a material having a good heat radiating property (heat radiation material) may be used. For example, as a material of the metal base, Cu, CuMo, a mixed material of diamond with Cu, Ag, Al or the like and a like material can be used.

Further, while, for example, in the embodiment described hereinabove, the description is given taking a base in which a mounting part such as a semiconductor chip or a second multilayer substrate is mounted using a solder of, for example, AuSn as an example, the present invention is not limited to this. In particular, the mounting part may be mounted otherwise using, for example, a electrically-conducting adhesive.

All examples and conditional language recited herein are intended for pedagogical purposes to aid the reader in understanding the invention and the concepts contributed by the inventor to further the art, and are not to be construed as limitations to such specifically recited examples and conditions, nor does the organization of such examples in the specification relates to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A stacked module, comprising:
a first multilayer substrate that includes an opening having a stepwise wall face, and a first transmission line configured from a first line conductor provided on a front face side of a first substrate and a first grounding conductor layer provided on a back face side of the first substrate;
a second multilayer substrate supported on a stepped portion provided on the stepwise wall face of the opening and including a second transmission line configured from a second line conductor provided on a front face side of a second substrate and a second grounding conductor layer provided on a back face side of the second substrate;
a first semiconductor chip mounted on a bottom face of the opening of the first multilayer substrate and electrically coupled to a third transmission line provided on the first multilayer substrate; and
a second semiconductor chip mounted on the front face of the second multilayer substrate and electrically coupled to the second transmission line; wherein
a face to which the second grounding conductor layer or a fourth grounding conductor layer electrically coupled to the second grounding conductor layer is exposed is joined to the stepped portion provided on the first grounding conductor layer or on the opposite side of the first grounding conductor layer across the substrate on the lower side of the first grounding conductor layer and to which a third grounding conductor layer electrically coupled to the first grounding conductor layer is exposed, and the first grounding conductor layer and the second grounding conductor layer are electrically coupled to each other.

2. The stacked module according to claim 1, wherein the second multilayer substrate includes a projecting portion that has a smaller number of stacked layers at an outer side portion thereof and that projects, at a front face side portion thereof, to the outer side with respect to a back face portion thereof, and the face to which the second grounding conductor layer or the fourth grounding conductor layer is exposed is the back face of the projecting portion.

3. The stacked module according to claim 2, wherein the back face of the projecting portion to which the second grounding conductor layer is exposed is joined to the stepped portion to which the first grounding conductor layer is exposed, and the first grounding conductor layer and the second grounding conductor layer are electrically coupled to each other.

4. The stacked module according to claim 2, wherein the back face of the projecting portion to which the fourth grounding conductor layer is exposed is joined to the stepped portion to which the first grounding conductor layer is exposed, and the first grounding conductor layer and the second grounding conductor layer are electrically coupled to each other.

5. The stacked module according to claim 4, wherein the second substrate has a thickness smaller than that of the first substrate; and the fourth grounding conductor layer is provided on the opposite side of the second grounding conductor layer across a substrate that has a thickness smaller than that of the first substrate on the lower side of the second grounding conductor layer.

6. The stacked module according to claim 2, wherein the back face of the projecting portion to which the second grounding conductor layer is exposed is joined to the stepped portion to which the third grounding conductor layer is exposed, and the first grounding conductor layer and the second grounding conductor layer are electrically coupled to each other.

7. The stacked module according to claim 2, wherein the back face of the projecting portion to which the fourth grounding conductor layer is exposed is joined to the stepped portion to which the third grounding conductor layer is exposed, and the first grounding conductor layer and the second grounding conductor layer are electrically coupled to each other.

8. The stacked module according to claim 1, wherein the bottom face of the second multilayer substrate to which the fourth grounding conductor layer is exposed is joined to the stepped portion to which the first grounding conductor layer is exposed, and the first grounding conductor layer and the second grounding conductor layer are electrically coupled to each other.

9. The stacked module according to claim 1, wherein the face to which the second grounding conductor layer or the fourth grounding conductor layer is exposed is joined by soldering to the stepped portion to which the first grounding conductor layer or the third grounding conductor layer is exposed, and the first grounding conductor layer and the second grounding conductor layer are electrically coupled to each other.

10. The stacked module according to claim 1, wherein a grounding conductor layer is formed on the back face of the second multilayer substrate.

11. The stacked module according to claim 1, wherein a transmission or reception semiconductor chip is provided as the first semiconductor chip; and a reception or transmission semiconductor chip is provided as the second semiconductor chip.

* * * * *